US010338261B2

(12) United States Patent
Gann et al.

(10) Patent No.: US 10,338,261 B2
(45) Date of Patent: Jul. 2, 2019

(54) MEASUREMENT OF MAGNETIC FIELD GRADIENTS

(71) Applicant: Raytheon Company, Waltham, MA (US)

(72) Inventors: Matthew E. Gann, Waltham, MA (US); Benjamin Dolgin, Alexandria, VA (US); James C. Zellner, Centreville, VA (US); Ender E. Barillas, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 265 days.

(21) Appl. No.: 14/856,356

(22) Filed: Sep. 16, 2015

(65) Prior Publication Data

US 2017/0075020 A1 Mar. 16, 2017

(51) Int. Cl.
*G01V 3/16* (2006.01)
*G01D 18/00* (2006.01)
*G01R 33/022* (2006.01)
*G01R 33/00* (2006.01)
*G01V 3/165* (2006.01)

(52) U.S. Cl.
CPC .............. *G01V 3/16* (2013.01); *G01D 18/004* (2013.01); *G01R 33/0029* (2013.01); *G01R 33/022* (2013.01); *G01V 3/165* (2013.01)

(58) Field of Classification Search
None
See application file for complete search history.

(56) References Cited

U.S. PATENT DOCUMENTS

| 4,686,474 | A | 8/1987 | Olsen et al. |
| 5,122,744 | A | 6/1992 | Koch |
| 5,126,669 | A | 6/1992 | Honess et al. |
| 6,114,995 | A | 9/2000 | Ketchum |
| 6,484,131 | B1 | 11/2002 | Amorai-Moriya et al. |
| 6,539,327 | B1 | 3/2003 | Dassot et al. |
| 6,882,146 | B2 | 4/2005 | Maiwald |
| 7,257,483 | B2 | 8/2007 | Blain et al. |
| 7,280,917 | B2 | 10/2007 | Hager et al. |
| 7,525,309 | B2 | 4/2009 | Sherman et al. |

(Continued)

FOREIGN PATENT DOCUMENTS

| EP | 2615419 A2 | 7/2013 |
| EP | 2615420 A2 | 7/2013 |
| GB | 2428827 A | 2/2007 |

OTHER PUBLICATIONS

Woodman, Oliver J. 2007 Technical Report http://www.cl.cam.ac.uk/techreports/UCAM-CL-TR-696.pdf.*

(Continued)

*Primary Examiner* — Roy Y Yi

(57) ABSTRACT

Technology for performing magnetic field gradient measurements is described. The magnetic field gradient measurements for specific positions on the Earth can be performed from a moving platform. The magnetic field gradient measurements can be identified as being affected by a level of error that exceeds a defined threshold. A correction value can be generated to compensate for the error in the magnetic field gradient measurements. The correction value can be applied to the magnetic field gradient measurements in order to obtain magnetic field gradient measurements with a reduced level of error.

18 Claims, 13 Drawing Sheets

(56) References Cited

U.S. PATENT DOCUMENTS

| | | | |
|---|---|---|---|
| 7,573,258 | B2 | 8/2009 | Anderson |
| 7,579,828 | B2 | 8/2009 | Laforest et al. |
| 7,707,004 | B2 | 4/2010 | Edelstein |
| 7,782,046 | B2 | 8/2010 | Anderson |
| 7,932,718 | B1 | 4/2011 | Wiegert |
| 8,311,767 | B1 * | 11/2012 | Stetson ............... G01R 33/032 |
| | | | 702/152 |
| 8,315,794 | B1 | 11/2012 | Strelow et al. |
| 8,386,180 | B2 | 2/2013 | Davies |
| 8,412,450 | B1 | 4/2013 | Huebner et al. |
| 8,575,929 | B1 | 11/2013 | Wiegert |
| 8,862,200 | B2 | 10/2014 | Sherman et al. |
| 9,187,152 | B2 * | 11/2015 | Bailey ..................... B63B 21/30 |
| 9,625,535 | B2 | 4/2017 | Cadugan et al. |
| 9,683,851 | B2 | 6/2017 | Haverinen |
| 9,703,001 | B2 | 7/2017 | Hautson et al. |
| 2003/0149528 | A1 | 8/2003 | Lin |
| 2003/0176970 | A1 * | 9/2003 | Lin ....................... G01C 21/165 |
| | | | 701/469 |
| 2004/0123474 | A1 | 7/2004 | Manfred et al. |
| 2005/0017721 | A1 | 1/2005 | McCracken et al. |
| 2005/0116717 | A1 * | 6/2005 | Dransfield ............. G01V 3/165 |
| | | | 324/331 |
| 2005/0234644 | A1 | 10/2005 | Lin |
| 2007/0244631 | A1 | 10/2007 | Jung et al. |
| 2009/0278535 | A1 | 11/2009 | Takizawa et al. |
| 2010/0100695 | A1 | 4/2010 | Sudo et al. |
| 2011/0066395 | A1 * | 3/2011 | Judd ....................... G01C 19/56 |
| | | | 702/104 |
| 2012/0086438 | A1 | 4/2012 | Tu |
| 2012/0271546 | A1 | 10/2012 | Pyne et al. |
| 2012/0326707 | A1 | 12/2012 | Webb et al. |
| 2013/0085666 | A1 | 4/2013 | Zhang et al. |
| 2013/0217713 | A1 | 8/2013 | Delmar et al. |
| 2014/0052375 | A1 | 2/2014 | Brewster |
| 2014/0197819 | A1 * | 7/2014 | Lin .......................... G01D 5/14 |
| | | | 324/207.11 |
| 2015/0370346 | A1 | 12/2015 | Smus et al. |
| 2016/0021512 | A1 | 1/2016 | Krallman et al. |
| 2016/0165323 | A1 | 6/2016 | Hollis |

OTHER PUBLICATIONS

Pang, Hongfeng, Qi Zhang, Ji Li, Shitu Luo, Dixiang Chen, Mengchun Pan, and Feilu Luo. 2014. "Improvement of vector compensation method for vehicle magnetic distortion field." Journal of Magnetism and Magnetic Materials 353, 1-5.*

Li, Ji1, et al. "Magnetic Interferential Field Compensation in Geomagnetic Measurement." Transactions of the Institute of Measurement & Control, vol. 36, No. 2, Apr. 2014, pp. 244-251.*

M. El-Diasty, "An Accurate Heading Solution using MEMS-based Gyroscope and Magnetometer Integrated System (Preliminary Results)," ISPRS Annals of the Photogrammetry, Remote Sensing and Spatial Information Sciences, vol. II, (2), pp. 75-78, 2014.*

Gordon, Robert, An oribtal gyrocompass heading reference for satellite vehicles, Journal of Spacecraft and Rockets 1965 2:6, 851-856.*

Bienaime, How The Navy's Latest Anti-Submarine Aircraft Sees Under The Waves, http://www.businessinsider.com/how-the-navys-latest-anti-submarine-aircraft-sees-under-the-waves-2014-11, Nov. 27, 2014, 3 pages, Business Insider Inc., New York City, NY.

Gamey et al., A Comparison of Towed and Mounted Helicopter Magnetometer Systems for Uxo Detection, 12th EEGS Symposium on the Application of Geophysics to Engineering and Environmental Problems, Mar. 14, 1999, 10 pages, EAGE, Netherlands.

Hogg et al., A new helicopter towed 3-axis magnetic gradiometer and mapping system, KEGS PDAC Symposium: "Recent Developments in Passive Geophysical Methods", Mar. 1, 2008, 8 pages.

Liu et al., Intelligent Geomagnetic Matching Method, International Conference on Intelligent Computing and Integrated Systems, Oct. 22-24, 2010, pp. 494-497, IEEE, China.

Luo et al., Research on Geomagnetic-Matching Technology Based on Improved ICP Algorithm, International Conference on Information and Automation, Jun. 20-23, 2008, pp. 815-819, IEEE, China.

Richard, A Three Axis Magnetometer for use in a Small Satellite, International Conference on Applied Electronics, Sep. 6-7, 2006, 4 pages, IEEE, Czech Republic.

Wilson et al., Passive Navigation Using Local Magnetic Field Variations, ION NTM 2006, Jan. 18-20, 2006, 10 pages, Monterey, CA.

International Search Report for International Application No. PCT/US2016/051996 dated Jun. 1, 2017, 14 pages.

International Search Report for International Application No. PCT/US2016/051997 dated Jan. 3, 2017, 13 pages.

* cited by examiner

MEASUREMENT OF MAGNETIC FIELD GRADIENTS

BACKGROUND

The Earth's magnetic field, also known as a geomagnetic field, is a magnetic field that extends from the Earth's interior to a region above the Earth that is exposed to solar wind (i.e., a stream of charged particles that are exposed from the Sun). Magnetic fields are vector quantities that are characterized by both strength and direction. The magnitude of the Earth's magnetic field at the Earth's surface can range from 20 to 80 microtesla (mT). This range is equal to 0.20 to 0.80 gauss or 20,000 to 80,000 nanotesla (nT). The magnitude of the Earth's magnetic field can vary depending on location.

Magnetic field variations due to magnetic anomalies can be in the picotesla (pT) range. In general, magnetic anomalies are local variations in the Earth's magnetic field resulting from variations in the chemistry or magnetism of the rocks. For example, magnetic surveys over the oceans have revealed a characteristic pattern of anomalies around mid-ocean ridges. These patterns involve a series of positive and negative anomalies in the intensity of the magnetic field, which form stripes running parallel to each ridge. The source of these magnetic anomalies can be from magnetization carried by titanomagnetite minerals in basalt and gabbros, which are magnetized when ocean crust is formed at the ridge.

The Earth's magnetic field and magnetic field anomalies can be measured using a measurement instrument referred to as a magnetometer. Examples of magnetometer include vector magnetometers and scalar magnetometers. Vector magnetometers can measure vector components of the Earth's magnetic field. Scalar magnetometers can measure the magnitude of a vector magnetic field. Magnetometers can also be classified based on their intended use. For example, stationary magnetometers can be installed to a fixed position and measurements are taken when the magnetometer is stationary. On the other hand, portable magnetometers are usable while in motion and can be transported in a moving vehicle.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
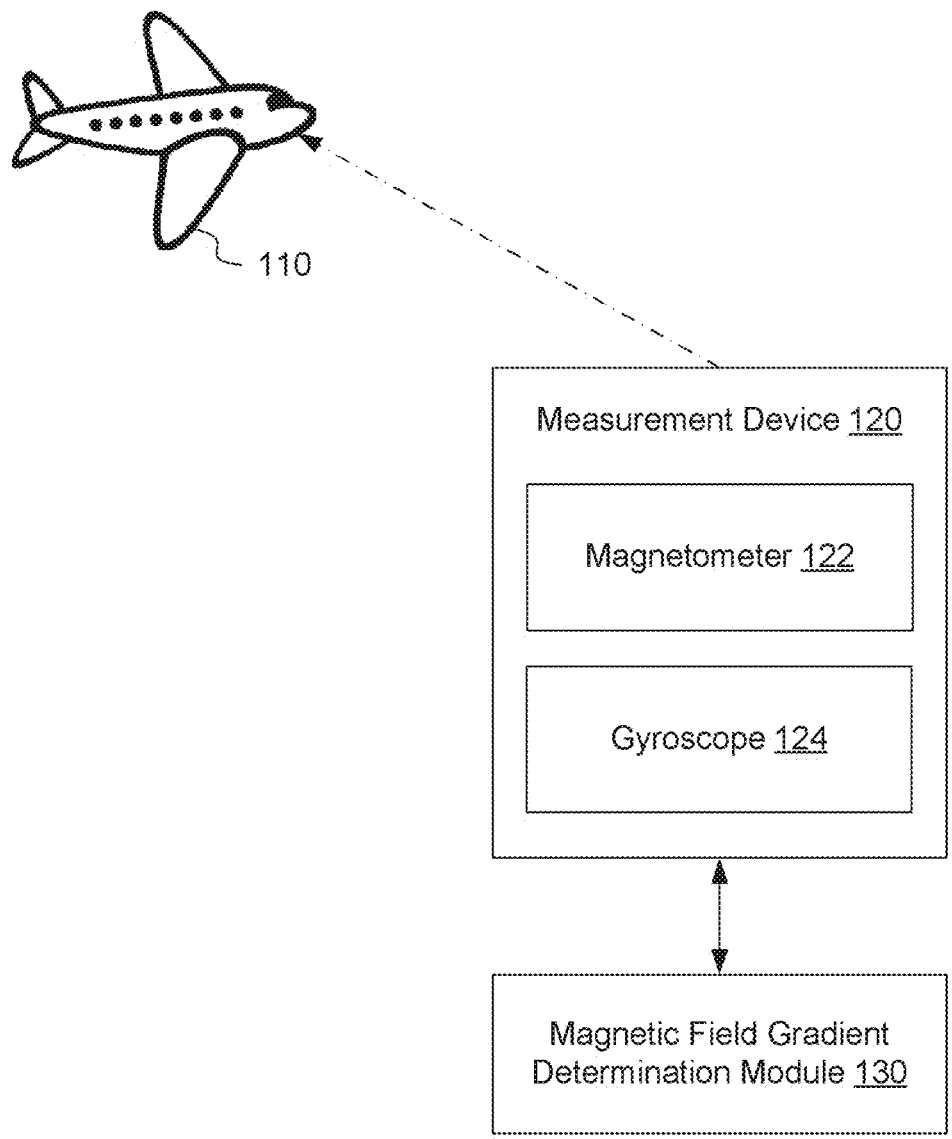
FIG. 1 illustrates a system for determining a magnetic field gradient of the Earth using a magnetometer installed on a moving platform in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly and is not intended to identify key features or essential features of the technology, nor is it intended to limit the scope of the claimed subject matter.

A technology is described for collecting magnetic field gradient measurements, and then using the magnetic field gradient measurements as a navigation aid. A moving platform (e.g., a missile or an aircraft) can continuously take magnetic field gradient measurements while traveling to a destination. The magnetic field gradient measurements can be that of the Earth's magnetic anomaly field. In one example, a magnetometer onboard the moving platform can measure the Earth's magnetic field gradients as the moving platform travels to the destination. The magnetometer can be a coil vector magnetometer. The magnetometer can measure a change in the Earth's magnetic anomaly field as a function of time. As a non-limiting example, the magnetometer can take magnetic field gradient measurements according to a range of approximately 2000 to 50,000 times per second. The magnetic field gradient measurements can also be referred to as a magnetic field gradient tensor. The magnetic field gradient tensor is a 3×3 matrix, so the magnetic field gradient tensor has nine components. While the platform is moving, the magnetometer may not measure all nine components at the same time. Rather, the magnetometer can measure the components associated with a current direction of the moving platform. Therefore, the magnetometer can measure a projection of the magnetic field gradient tensor onto the direction of motion. In one example, the moving platform can travel to the destination at a defined velocity, such as Mach 0.8 or 280 meters/second.

In one configuration, the magnetometer can be coupled to a gyroscope. The gyroscope coupled to the magnetometer can be separate from a gyroscope that is part of the Inertial Navigation System of the moving platform. The gyroscope coupled to the magnetometer can compensate for error in the magnetic field gradient measurements due to, for example, the relatively high velocity at which the moving platform is traveling. The relatively high velocity of the moving platform can cause high frequency vibrations on the moving platform, which can create undesired voltage in the magnetometer coils, thereby resulting in less accurate magnetic field gradient measurements. Thus, the gyroscope coupled to the magnetometer can compensate for fast vibration of the airframe.

In one example, the gyroscope coupled to the magnetometer can track a difference in orientation between the onboard inertial navigation system and the magnetometer. In other words, the gyroscope coupled to the magnetometer can track a misalignment between an orientation of an airframe body coordinate system (in which the velocity of the moving platform is measured) and an orientation of the magnetometer onboard the moving platform. The difference in orientation (or the misalignment) can cause error in the magnetic field gradient measurements. The gyroscope coupled to the magnetometer can generate a correction value (e.g., a relative rotation matrix) to compensate for this error in the magnetic field gradient measurements. The correction value can be applied to the magnetic field gradient measurements with the errors, thereby resulting in magnetic field gradient measurements having a reduced level of error. Without the gyroscope onboard the fast moving platform to compensate for the error due to the difference in orientation or misalignment, the accuracy of the magnetic field gradient measurements would be below an acceptable level.

In another aspect of the current technology, the moving platform can use the magnetic field gradient measurements for navigation purposes. The magnetic field gradient measurements can be used as part of a magnetic field navigation system. In other words, the gradient of the Earth's geomagnetic anomaly field can be exploited to determine the moving platform's position. The magnetic field navigation system can also be referred to as magnetic aided INS navigation (MAIN). The moving platform can utilize a global positioning system (GPS) aided inertial navigation system (INS). The magnetic field navigation system can be used in place of GPS. In another example, the position provided by the magnetic field navigation system can be used to correct for INS drift. Thus, an orientation of the gyroscope that is part of the moving platform's INS system (as opposed to the gyroscope that is coupled to the magnetometer) can be corrected for INS drift. The magnetometer onboard the moving platform can continuously measure the magnetic field gradients of the Earth while the moving platform is traveling to the destination. In one example, the magnetic field gradients can be measured between 2,000 times per second and 50,000 times per second. The sequence of magnetic field gradient measurements can correspond to the path traveled by the moving platform. The sequence of magnetic field gradient measurements can be compared to a reference magnetic field gradient map. In particular, the sequence can be compared to a plurality of possible trajectories derived from the reference magnetic field gradient map. Each of the possible trajectories is associated with a set of known magnetic field gradients. The reference magnetic field gradient map is a topographical map of the Earth's magnetic anomaly field. The reference magnetic field gradient map can be provided by an external source, such as the National Geophysical Data Center (NGDC). Based on the comparison, a trajectory derived from the reference magnetic field gradient map that most closely correlates to the sequence of magnetic field gradient measurements can be identified. In other words, the identified trajectory can be inferred as being substantially the same trajectory (or path) taken by the moving platform. The trajectory can have known geographical coordinates, and therefore, the geographical location of the moving platform can be determined based on the known geographical coordinates of the trajectory. As a result, the moving platform can determine its geographical location using the magnetic field navigation system and without reliance on GPS. In particular, the known geographical coordinates of the trajectory can be used to mitigate position error of the moving platform. Thus, the known geographical coordinates can be used to improve an INS solution, and thereby, lead to the determination of the moving platform's latitude, longitude and altitude.

Measuring Magnetic Field Gradients

FIG. 1 illustrates an exemplary system for determining a magnetic field gradient of the Earth using a magnetometer 122 installed on a moving platform 110 (e.g., an aircraft). The magnetic field gradient (or magnetic field gradient tensor) can be of the Earth's magnetic anomaly field. The magnetic field gradient can also refer to measured spatial variations in the Earth's magnetic anomaly field. The magnetometer 122 can be a vector magnetometer or an inductive coil vector magnetometer. The magnetometer 122 can be part of a measurement device 120 that is installed on the moving platform 110. The moving platform 110 can be traveling at a defined velocity (e.g., Mach 0.5 or higher). As explained in greater detail below, magnetic field gradient measurements can provide a navigation aid for the moving platform 110.

In one example, the magnetometer 122 can include a 3-axis coil magnetic antenna to measure the magnetic gradient of the Earth's anomaly field. The magnetometer 122 can measure the magnetic field gradient while the moving platform 110 is traveling over land or water. The magnetic antenna can take readings of the magnetic field as the moving platform 110 (or airborne platform) moves along its trajectory. In one configuration, the magnetometer 122 can continuously measure (e.g., 20,000 measurements per second) the magnetic field gradient associated with the moving platform's current position on the Earth.

In one configuration, with respect to performing the magnetic field gradient measurements, a magnetic coil of the magnetometer can generate voltage that is proportional to a change of magnetic flux through that magnetic coil. The magnetic flux is described by: Flux through coil "i"=$\overline{A}_i \cdot \overline{B}$; where i=x, y, z (1). The magnetometer can measure three components: the changes of magnetic flux through each of the magnetic coils x, y and z. Each of these are described by: Voltage in coil $$"i" = \vec{A}_i \cdot \frac{d\vec{B}}{dt};$$

where i=x, y, z (2). Note that the subscript "i" can be used to describe the three components. If the magnetic coil is moved through a magnetic field, then the change in magnetic flux can be caused by three mechanisms. A first mechanism is the time dependent change of the magnetic field itself, whether the magnetic coil moves or does not move. A second mechanism is a change in orientation of the magnetic coil with the magnetic field regardless of whether the magnetic field is constant or not constant. A third mechanism is the movement of the magnetic coil from a location with one value of the magnetic field to a location with another value of the magnetic field.

The three components measured by the magnetometer are the terms described by the three terms in the following equation:

$$\vec{A}_i \cdot \frac{\partial \vec{B}}{\partial t} + \vec{B} \cdot \frac{\partial \vec{A}_i}{\partial t} + \vec{A}_i \cdot \nabla \vec{B} \cdot \vec{v}. \quad (3)$$

The third term of the equation (i.e., $\vec{A}_i \cdot \nabla \vec{B} \cdot \vec{v}$) can also be represented as $$\vec{A}_i \cdot \nabla \vec{B} \cdot \vec{v} = \| A_i^x \quad A_i^y \quad A_i^z \| \cdot \begin{Vmatrix} \frac{\partial B_x}{\partial x} & \frac{\partial B_x}{\partial y} & \frac{\partial B_x}{\partial z} \\ \frac{\partial B_x}{\partial y} & \frac{\partial B_y}{\partial y} & \frac{\partial B_y}{\partial z} \\ \frac{\partial B_x}{\partial z} & \frac{\partial B_z}{\partial y} & \frac{\partial B_z}{\partial z} \end{Vmatrix} \cdot \begin{Vmatrix} \frac{dx}{dt} \\ \frac{dy}{dt} \\ \frac{dz}{dt} \end{Vmatrix}. \quad (4)$$

The first part of the third term of the equation (i.e., $\|A_i^x \ A_i^y \ A_i^z\|$) is a vector orientation of the coil "i". The second part of the third term of the equation $$\left( \text{i.e.,} \begin{Vmatrix} \partial B_x/\partial x & \partial B_x/\partial y & \partial B_x/\partial z \\ \partial B_x/\partial y & \partial B_y/\partial y & \partial B_y/\partial z \\ \partial B_x/\partial z & \partial B_z/\partial y & \partial B_z/\partial z \end{Vmatrix} \right)$$

is a magnetic field gradient tensor. As shown, the magnetic field gradient tensor is a 3×3 matrix. The magnetic field is a vector with three components, and the magnetic field gradient can exist when the moving platform travels in one of the three directions. The third part of the third term of the equation $$\left( \text{i.e.,} \begin{Vmatrix} dx/dt \\ dy/dt \\ dz/dt \end{Vmatrix} \right)$$

is the platform velocity $\vec{v}$. The velocity of the moving platform can be used as a tool in measuring the magnetic field gradients.

In the present application, although the magnetic field gradient tensor has nine components, the magnetometer onboard the moving platform may not measure all nine components. Rather, the magnetometer can measure the components associated with the direction of the moving platform. Thus, the three components of the product $\nabla \vec{B} \cdot \vec{v}$ can be measured, which is the projection of the magnetic field gradient onto the direction of motion. In one example, the vertical component of this projection, or $\vec{B}_s \cdot \nabla \vec{B} \cdot \vec{v}$, can be used.

The magnetometer can measure the magnetic field as the platform is moving. As an example, the magnetometer can measure the magnetic field in Point A. The magnetometer can move to Point B and measure the corresponding magnetic field. The magnetic field gradient in Point A can be subtracted from the magnetic field gradient in Point B in order to determine a change in the magnetic field gradient when the moving platform travels from Point A to Point B. Therefore, the magnetometer can measure the change in magnetic field as a function of time.

In one configuration, as the flight trajectory is traversed, each coil of the magnetometer 122 can generate a voltage that is proportional to the speed at which the platform 110 is traveling. The magnetometer 122 can measure a signal that is proportional to a time derivative of the magnetic field sensed by the magnetometer 122. As the platform 110 moves, the value of the time derivative is equal to the projection of the magnetic field gradient tensor upon the direction of a velocity vector (corresponding to the moving platform's velocity) multiplied by an amplitude of the velocity vector (or a ground velocity). Transient magnetic phenomena can inject additional signal into the magnetic field gradient tensor outputted by the magnetometer 122.

In one configuration, the signal in the magnetometer 122 is determined by the electromotive force in each of the three orthogonal coils that comprise the magnetometer 122 (e.g., a vector magnetometer). The signal from each of the coils is proportional to the change of the magnetic flux through the coil as it moves through the magnetic field. The signal in each of the coils is:

$$V_i = \frac{d(\vec{A}_i \cdot \vec{B})}{dt},$$

wherein $V_i$ is the voltage in the coil i, $\vec{B}_i$ is the orientation of coil i, and $\vec{B}$ is the magnetic field. In addition, the equation above can be expanded as follows:

$$\frac{d(\vec{A}_i \cdot \vec{B})}{dt} = \frac{\partial(\vec{A}_i \cdot \vec{B})}{\partial t} + \nabla(\vec{A}_i \cdot \vec{B}) \cdot \frac{d\vec{r}}{dt} = \vec{A}_i \cdot \frac{\partial \vec{B}}{\partial t} + \vec{B} \cdot \frac{\partial \vec{A}_i}{\partial t} + (\vec{A}_i \cdot \nabla \vec{B}) \cdot \vec{v},$$

wherein $\nabla \vec{B}$ is the magnetic gradient tensor, and $\vec{v}$ represents the platform velocity vector.

The magnetic field represented above includes a total magnetic field that is exposed to by the magnetometer 122. The total magnetic field includes the magnetic anomaly field of the Earth, as well as other sources that can generate a detectable magnetic field. The other sources include magnetic fields induced by globally occurring phenomenon such as space weather, diurnal variations to the field, lightning strikes (nearby and far away), magnetic jammers set by adversaries, and power transmission lines. Additionally, local magnetic sources such as fields generated by power supplies onboard the moving platform 110 and stray magnetic fields of the onboard motors and actuators can contribute to the total magnetic field.

Each of these magnetic fields is grouped into one of the different terms of the equation above. For example, the term $(\vec{B}_i \cdot \nabla \vec{A}) \cdot \vec{v}$ describes the gradient of the magnetic field component in the direction of $\vec{B}_i$ differentiated over the direction of the velocity vector ($\vec{v}$). This term represents the signal from the magnetometer 122. This signal is measured in the magnetic sensor coordinate system, as signified by the presence of vector $\vec{B}_i$. The term $\vec{A}_i \cdot \partial \vec{A}/\partial t$ describes the signal due to changes in the orientation of the magnetometer 122 in the external magnetic field. As described below, this is a noise source that is caused by mechanical vibration of the magnetometer 122. In one example, vibration caused by a motor is correlated with the variable magnetic field of that motor. The term $\vec{B}_i \cdot \partial \vec{A}/\partial t$ describes the signal due to temporal changes in a background magnetic field. These changes can be separated into two distinct groups: local environment and global environment. Local environment describes variable magnetic fields generated by elements of the moving platform 110 (e.g., an aircraft), such as motors, actuator, electronics, and ferromagnetic elements of the moving platform 110. The global environment refers to variable fields that are generated outside the moving platform 110, such as space weather and diurnal variation.

In one configuration, the magnetometer onboard the moving platform can continuously sample the magnetic field gradient. In other words, the magnetometer can perform high frequency sampling of the magnetic field gradient. The magnetometer can continuously output the magnetic field gradients as a function of time. As a non-limiting example, the magnetometer can measure the magnetic field gradient approximately 2,000 times per second. As another non-limiting example, the magnetometer can measure the magnetic field gradient approximately 50,000 times per second.

The moving platform 110 can travel at a defined velocity. As a non-limiting example, the defined velocity can be at least Mach 0.5. The magnetometer 122 on the moving platform 110 can take measurements of the magnetic field gradient of the Earth as the moving platform 110 travels at the defined velocity. In one example, the relatively high velocity of the moving platform 110 can cause a misalignment between a local coordinate system associated with the moving platform 110 and an orientation of the magnetometer 122. In particular, the misalignment can be a result of vibrations of the moving platform 110 due to the relatively high velocity of the moving platform 110. This misalignment can result in errors in the magnetic field gradient measurements. As a non-limiting example, when the moving platform 110 is traveling at a speed of Mach 0.5 or higher, the amount of resulting error in the magnetic field gradient measurements due to the misalignment can be beyond an acceptable noise level. As a result of the error, the magnetic field gradient measurements can be inaccurate. On the other hand, moving platforms that travel at slower speeds have a reduced signal to noise ratio (SNR) as compared to moving platforms that travel at higher speeds, which results in difficulty when isolating the real magnetic field from the error.

The high frequency vibrations can cause misalignment of the local coordinate system associated with the moving platform 110 and an orientation of the magnetometer 122. The local coordinate system can include an airframe body coordinate system in which the velocity of the moving platform 110 is measured using global coordinates. In particular, an onboard navigation system that operates using the local coordinate system can provide the velocity (or velocity vector) for the moving platform 110. The misalignment (or the difference in orientation between the magnetometer and the onboard navigation system) can result in additional noise in the magnetic field gradients measured at the magnetometer 122. As a result of the noise, the magnetic field gradient measurements can be inaccurate or invalid.

In one configuration, the magnetometer 122 can be coupled to a high rate gyroscope 124. The magnetometer 122 coupled to the gyroscope 124 can be referred to as a gradiometer. The gyroscope 124 can generate a correction value that compensates for the error in the magnetic field gradient measurements due to the misalignment between the magnetometer 122 and the onboard navigation system (e.g., the INS system). Since the gyroscope 124 coupled to the magnetometer 122 may not be coupled to the INS system, the high frequency vibrations of the mechanical frame of the moving platform can result in the errors in the magnetic field gradient measurements. The gyroscope 124 can also be referred to as a compensation gyroscope 124 that provides motion compensation. In particular, the gyroscope 124 can track a difference in orientation between the onboard navigation system (which operates using the local coordinate system and provides the moving platform's velocity) and the magnetometer 122. The difference in orientation can be the correction value. The correction value can also be referred to as a rotation matrix or a relative rotation matrix. The gyroscope 124 can operate in the high frequency domain and provide the relative rotation matrix to relate a magnetometer antenna and the local coordinate system (e.g., the airframe body coordinate system). The rotation matrix can be 3×3 in size, which corresponds to the three dimensions X, Y and Z. The rotation matrix can effectively fix the magnetometer's disorientation. The correction value (or rotation matrix), when applied to a magnetic field gradient measurement, having error can result in a magnetic field gradient measurement with a reduced level of error. Therefore, the gyroscope 124 can effectively correct the orientation of the magnetometer 122. The gyroscope 124 coupled to the magnetometer 122 for correcting the orientation can be distinct from a gyroscope that is part of the moving platform's INS system.

As previously described, the magnetic field gradient can be calculated based on the magnetometer's orientation (as well as the voltage in the coil, the magnetic field, and the velocity). Thus, if the orientation is inaccurate, the calculated magnetic field gradient can be inaccurate as well. Therefore, the correction value (or rotation matrix) can effectively correct or compensate for the inaccuracies in the magnetometer's orientation. As a result, the calculated magnetic field gradient can be substantially accurate, even when the magnetometer 122 is disoriented due to the moving platform's high velocity.

In one configuration, a magnetic field gradient determination module 130 can be onboard the moving platform 110. The magnetic field gradient determination module 130 can receive the signal (or 3-coil output) from the magnetometer 122. The signal can be low-pass-filtered, as well as related to the magnetic field gradient and the speed vector of the magnetometer 122 in an Earth-fixed coordinate system. The signal (or output) from the magnetometer 122 can be a projection of the magnetic field gradient onto the moving platform's velocity vector. In addition, the magnetic field gradient determination module 130 can receive the correction value from the gyroscope 124. The magnetic field gradient determination module 130 can reduce the error in the signal (i.e., the magnetic field gradient measurements) by applying the correction value to the noisy magnetic field gradient measurements. In other words, the magnetic field gradient determination module 130 can calculate the three components of the magnetic field gradient tensor in the local coordinate system as a product of the signal or 3-coil output provided by the magnetometer 122 and the 3×3 rotation matrix provided by the gyroscope 124. Therefore, even when the magnetometer 122 becomes disoriented due to the moving platform's relatively high speed and produces magnetic field gradient measurements with errors, the gyroscope 124 can compensate for the error, such that accurate magnetic field gradient measurements are taken from the moving platform 110.

In one example, the gyroscope 124 operates alongside the magnetometer 122 (or a magnetic antenna of the magnetometer 122) for the purpose of compensating for high frequency airframe vibrations (or platform instability). The output of the magnetic antenna and the output of the gyroscope 124 (i.e., the rotation matrix) can be provided to a subsequent function to determine the components of the magnetic field (X, Y, and Z) in a local sensor coordinate system. The components can be converted to a North East Down (NED) coordinate system of the moving platform 110 (or airborne platform) in order to generate the magnetic field gradient components.

As shown in the equation $$\vec{A}_i \cdot \frac{\partial B}{\partial t} + \vec{B} \cdot \frac{\partial \vec{A}_i}{\partial t} + \vec{A}_i \cdot \nabla \vec{B} \cdot \vec{v}, \quad (3)$$

the signal amplitude is proportional to the velocity (v). As the velocity is increased, the amount of vibration can increase. The compensation gyroscope that is coupled to the magnetometer, as described earlier, can mitigate this vibration. The velocity indirectly contributes to the second term of the equation, or $$\vec{B} \cdot \frac{\partial \vec{A}_i}{\partial t}.$$

This term describes the magnetometer vibrating in the constant $\vec{B}$ field. The rotation of the magnetometer due to the vibration can negatively impact the accuracy of the magnetic field gradient measurements. If the magnetometer vibrates without changing its orientation, the term above is zero. If the magnetometer does not rotate, then the values of the individual components of $\vec{B}$ do not change. Therefore, the derivative of the second term is zero, which results in the whole second term being zero. Therefore, linear translation of the magnetometer does not cause extra noise in the magnetic field gradient measurements, whereas rotation of the magnetometer can cause additional noise in the magnetic field gradient measurements. Therefore, the gyroscope coupled to the magnetometer can compensate for the magnetometer's rotation, which is measured by the gyroscope.

In one configuration, the magnetometer 122 is a vector magnetometer as opposed to a single coil magnetometer. While orientation variation of the single coil magnetometer cannot be compensated using a gyroscope, a vector magnetometer output can be corrected for noise by using a gyroscope.

In one configuration, the moving platform can include a magnetic navigation system (which includes the magnetometer coupled with a first gyroscope) and an inertial navigation system that includes a second gyroscope. In one example, the same gyroscope can be used for both the magnetic navigation system and the inertial navigation system. Over a period of time, the second gyroscope for the inertial navigation system can drift. As a non-limiting example, the inertial navigation system can drift by X degrees per minute. In order to determine how much the gyroscope has drifted, the magnetic field gradient measurements can provide an independent source for determining the moving platform's location. Therefore, the magnetic field gradient measurements can be used to correct for orientation drift of the inertial navigation system's gyroscope (i.e., the second gyroscope).

In one example, the magnetic field gradient measurements can be affected by noise in the system. Once source of the noise can be due to the vibration of the magnetometer. There are several ways in which the vibration of the magnetometer can impact the magnetic field gradient measurements that are being collected. In one example, the magnetometer can point in an incorrect direction as compared to the direction in which the inertial navigation system is pointing. For example, the inertial navigation system can be located in the nose of an aircraft, whereas the magnetometer can be located in the tail of the aircraft. The fact that these two systems are not collocated can introduce certain errors due to the vibration of the mechanical frame of the aircraft. In one example, the vibration of the aircraft can create an undesired signal in the magnetometer, which is another source of noise in the magnetic field gradient measurements.

A compensation gyroscope (or the first gyroscope coupled to the magnetometer) can compensate for errors in the magnetic field gradient measurements due to the vibrations. The first gyroscope coupled to or collocated with the magnetometer does not measure the slow rotation of the airframe, but rather can compensate for fast vibration of the airframe. This high frequency vibration can create an undesired voltage (or undesired signal) in the magnetometer coils, which causes errors in the magnetic field gradient measurements. The correction value from the first gyroscope can compensate for errors due to vibrations that cause the magnetometer to vibrate, as well as the vibrations that cause the magnetometer to not be oriented correctly with the INS system. Therefore, the moving platform can include two separate gyroscopes—the first gyroscope is collocated with the magnetometer and the second gyroscope is part of the INS system. The first gyroscope can compensate for vibration of the magnetometer and undesired signals that are created at the magnetometer due to the vibration. The second gyroscope that is part of the INS system can be used for navigation of the moving platform. Orientation drift of the second gyroscope can be corrected based on a known orientation determined by the magnetic navigation system.

Figure 2:
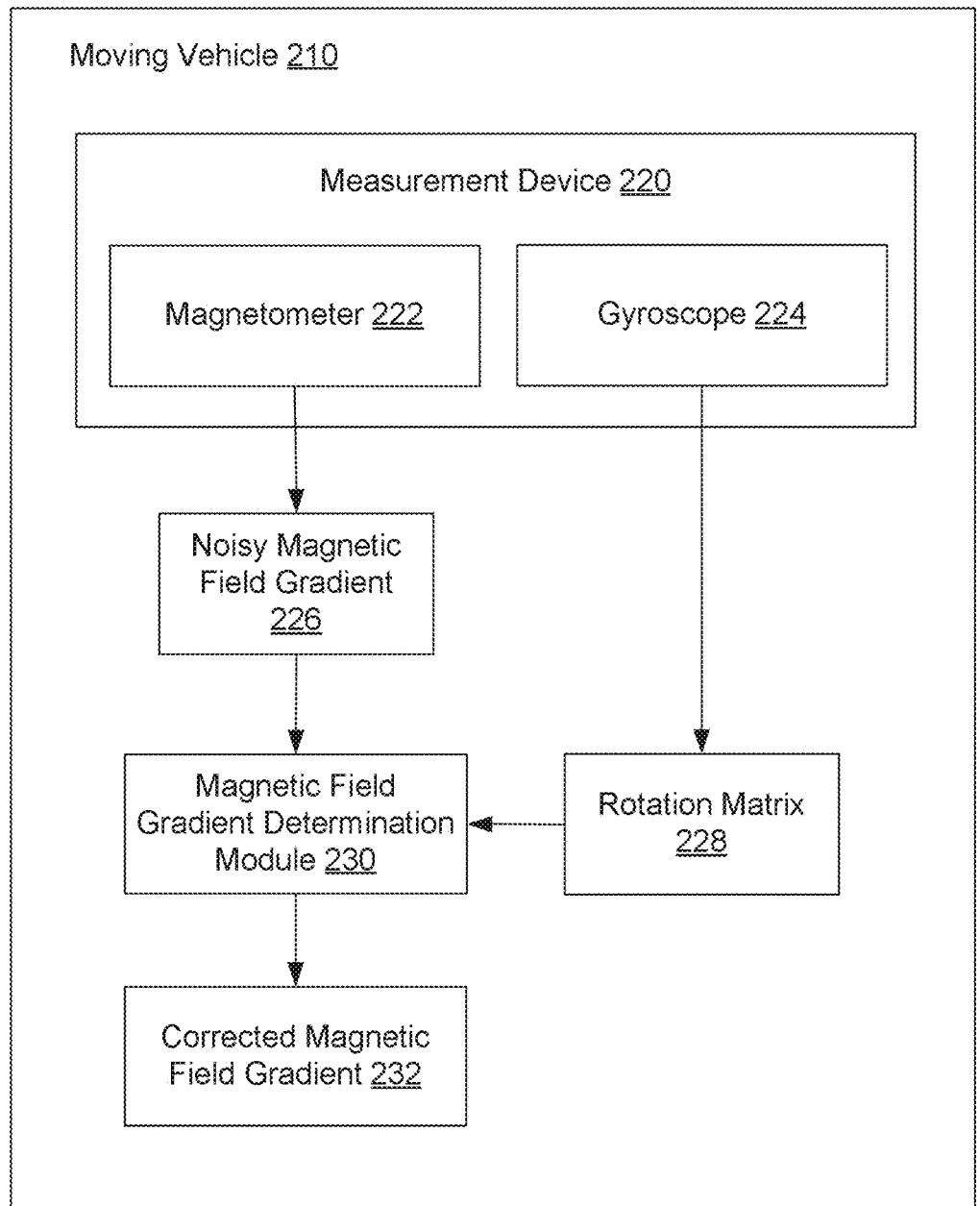
FIG. 2 illustrates a system and related operations for determining a magnetic field gradient of the Earth using a magnetometer installed on a moving platform in accordance with an example.

FIG. 2 illustrates an exemplary system and related operations for determining a magnetic field gradient of the Earth using a magnetometer 222 installed on a moving vehicle 210. Non-limiting examples of the moving vehicle 210 can include an aircraft or a self-propelled guided weapon, such as a missile. The magnetometer 222 (e.g., an induction coil vector magnetometer) can take magnetic field gradient measurements as the moving vehicle 210 travels to a destination. The magnetometer 222 can be part of a measurement device 220, such as a gradiometer. The measurement device 220 can also include a gyroscope 224. The gyroscope 224 can compensate for measurement errors of the magnetometer 222. The measurement errors can result from noise in the magnetic field gradient measurements due to the moving vehicle's velocity. For example, if the moving vehicle's velocity exceeds a certain threshold (e.g., Mach 0.5), then the amount of noise in the magnetic field gradient measurements can exceed a noise threshold and the gyroscope 224 can be activated. In other words, the gyroscope 224 can be used to reduce the noise in the magnetic field gradient measurements.

In one configuration, the magnetometer 222 can produce a noisy magnetic field gradient 226. As previously described, the noisy magnetic field gradient can result from a difference in orientation between the magnetometer 222 and an onboard navigation system (e.g., an INS system). The difference in orientation can occur due to the moving vehicle's relatively high velocity, which causes vibrations in the mechanical frame of the moving vehicle 210. The noisy magnetic field gradient 226 can be provided to a magnetic field gradient determination module 230. In addition, the magnetic field gradient determination module 230 can receive a rotation matrix 228 from the gyroscope 224. The rotation matrix 228 can also be referred to as a correction value. The rotation matrix 228 can be used to effectively reorient the magnetometer 222. The magnetic field gradient determination module 230 can multiply the noisy magnetic field gradient 226 with the rotation matrix 228 in order to produce a corrected magnetic field gradient 232. The corrected magnetic field gradient 232 can be a magnetic field gradient with a reduced amount of noise. As a result, even when the moving vehicle 210 travels at a relatively high speed that would ordinarily result in noisy magnetic field gradients, the use of the gyroscope 224 can result in relatively accurate magnetic field gradients. The relatively high speed can cause vibration noise that can limit the usefulness of the signals, but the gyroscope 224 can effectively remove that vibration noise.

Using Magnetic Field Gradients as a Navigation Aid

GPS signals are vulnerable to jamming and spoofing, especially in Anti-Access, Area Denial (A2AD) regions. As the concern of GPS-denial becomes more prevalent, the military's ability to maintain mission readiness and carry out operations becomes jeopardized. This drives the need for innovative capabilities to provide accurate navigation over extended periods of time and long distances, while acting independent of the GPS satellite network. The magnetic navigation system described herein, referred to as Magnetic Aided INS Navigation (MAIN), provides a technique for airborne platforms to navigate over long distances with no dependency on GPS.

The magnetic navigation system can utilize the measured magnetic field gradients (as described above) in order to provide a navigation aid. The magnetic navigation system can exploit the gradient of the Earth's magnetic anomaly field to provide error correction to onboard INS. The magnetic navigation system can be capable of operating in all weather conditions, day or night, over featureless terrain, over rough terrain, and over water. In addition, the magnetic navigation system can be effective during long-range and high-speed missions. The magnetic navigation system can operate without using additional infrastructure (e.g., radio towers or satellites).

Another benefit of the magnetic navigation system is its robustness with respect to jamming. Since magnetic waves are attenuated inversely proportional to a distance cubed, a large amount of energy is needed to distort the magnetic field over even a relatively small area. For an adversary to jam the magnetic navigation system, a magnetic field would have to be created that is strong enough to reach the system at the operational altitude and have an effect on the magnetic field gradient that is sensed by the system. For a mission of several hundred kilometers, the jamming signal would need to cover a large area to have an effect on the measured gradient value. Thus, the magnetic navigation system is substantially unsusceptible to jamming from adverse parties.

In one configuration, a moving platform (e.g., a cruise missile) can operate effectively in an A2AD environment where GPS is jammed using the present technology. During a launch phase of the mission, the cruise missile can be boosted in the direction of the target and guided using an inertial navigation system (INIS). In this case, GPS is available to the missile during launch and early in the cruise phase of the mission. At some point during the cruise phase, the missile enters the A2AD area and no longer has access to the GPS satellite constellation. At this point, the missile can rely solely on the magnetic navigation system to guide the missile during the remainder of the cruise phase. The magnetic navigation system can guide the missile to a target area, at which time a terminal phase is initiated. During the terminal phase, the missile can use more accurate seeker technology in order to guide the missile to the target.

Figure 3:
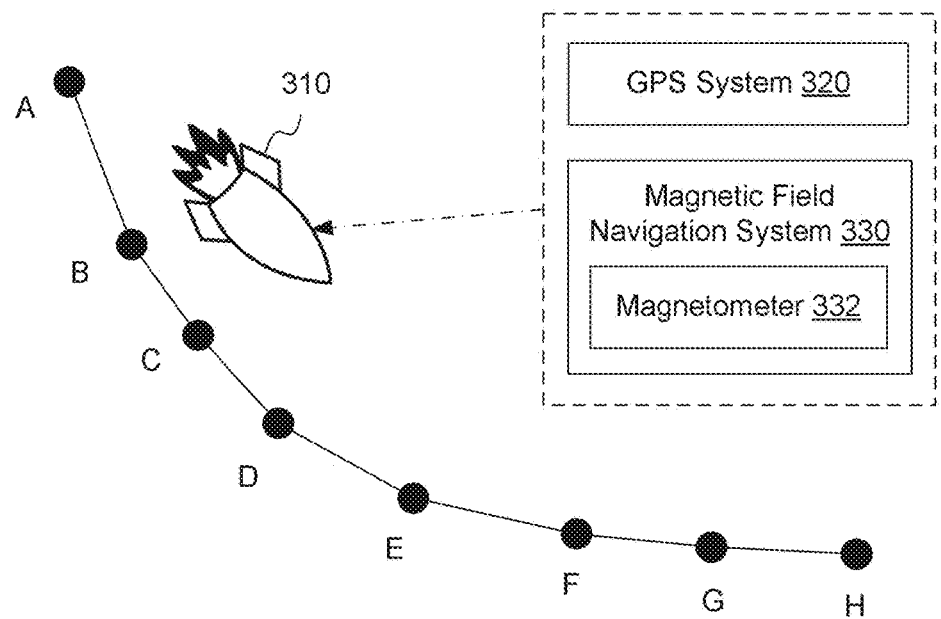
FIG. 3 illustrates a magnetometer on a moving platform that periodically measures a magnetic field gradient of the Earth in accordance with an example.

FIG. 3 illustrates a magnetometer 332 on a moving platform 310 that measures a magnetic field gradient of the Earth. In particular, the magnetic field gradient is of the Earth's magnetic anomaly field. In some examples, the magnetometer 332 is an induction coil vector magnetometer, and the moving platform 310 is a missile. However, the moving platform 310 can also include aircrafts (e.g., airplanes, helicopters) or other weapon systems. The magnetometer 332 can be included in a magnetic field navigation system 330 that is installed on the moving platform 310. The magnetic field navigation system 330 can be operable to provide the moving platform 310 with navigational capabilities using a plurality of magnetic field gradient measurements. In one configuration, the magnetic field navigation system 330 can be activated when a global positioning system (GPS) 320 on the moving platform 310 is jammed or inoperable. In an alternative configuration, the magnetic field navigation system 330 can be utilized even when the GPS 320 is functioning correctly or is not jammed.

The moving platform 310 can also include a navigation subsystem (not shown in FIG. 3). The navigation subsystem can include an inertial measurement unit (IMU), an inertial navigation unit (INU) and a Kalman filter. The IMU provides accumulated velocity change and angle change that corresponds to the trajectory of the moving platform 310 (e.g., an aircraft or weapon). These measurements are inputted to the INU for computation of a strapdown inertial navigation solution. Measurements from the INU are integrated to form position, velocity and attitude estimates for the moving platform 310. Errors in the IMU output and errors in the inertial navigation solution can be corrected using the Kalman filter. In other words, corrections to the INU can be provided via the Kalman filter. In addition, the IMU can be calibrated using the GPS 320 before the moving platform 310 enters a GPS-denied area. As explained in greater detail below, the magnetic field navigation system 330 can be used to correct drift in the INS.

In one example, the magnetometer 332 (e.g., via a magnetic antenna) can take magnetic field gradient measurements as the moving platform 310 travels to a destination. In the example shown in FIG. 3, the moving platform 310 can take magnetic field gradient measurements when traveling between positions A-H along a path to the destination. In other words, the magnetometer 332 can take magnetic field gradient measurement at position A, position B, and so on. In one example, the magnetometer 332 can continuously take magnetic field gradient measurements (e.g., the magnetometer 332 can continuously take measurements of the magnetic field gradient at 2,000 measurements per second or greater), and the moving platform's position estimate can be derived every so often (e.g., every 150 seconds or 56 km of travel). For example, the magnetometer 332 can take magnetic field gradient measurements at a rate of 2,000 measurements per second (or greater) over a duration of 150 seconds, and the magnetic field navigation system 330 can provide the navigation aid based on this information.

As previously described, each coil of the magnetometer 332 can generate a voltage that is proportional to the speed at which the platform 310 is traveling. The magnetometer 332 can measure a signal that is proportional to a time derivative of the magnetic field sensed by the magnetometer 332. The signal in the magnetometer 332 is determined by the electromotive force in each of the three orthogonal coils that comprise the magnetometer 332 (e.g., a vector magnetometer). The signal from each of the coils is proportional to the change of the magnetic flux through the coil as it moves through the magnetic field. The signal in each of the coils is:

$$V_i = \frac{d(\vec{A}_i \cdot \vec{B})}{dt},$$

wherein $V_i$ is the voltage in the coil i, $\vec{B}_i$ is the orientation of coil i, and $\vec{B}$ is the magnetic field. In addition, the equation above can be expanded as follows:

$$\frac{d(\vec{A}_i \cdot \vec{B})}{dt} = \frac{\partial(\vec{A}_i \cdot \vec{B})}{\partial t} + \nabla(\vec{A}_i \cdot \vec{B}) \cdot \frac{d\vec{r}}{dt} = \vec{A}_i \cdot \frac{\partial \vec{B}}{\partial t} + \vec{B} \cdot \frac{\partial \vec{A}_i}{\partial t} + (\vec{A}_i \cdot \nabla \vec{B}) \cdot \vec{v},$$

wherein $\nabla \vec{B}$ is the magnetic gradient tensor, and $\vec{v}$ represents the platform velocity vector.

The magnetometer 332 can provide measured values of a magnetic field tensor gradient. In an ideal scenario, the only magnetic field that would be present is the magnetic field of the Earth's magnetic anomaly field, as it is the magnetic anomaly field that is used by the magnetic field navigation system 330. However, other sources (e.g., global and local sources) that will be measured by each individual magnetometer coil. In addition, there are other sources associated with the coil assembly and calibration. The coils of the magnetometer 332 can also pick up changes of the magnetic flux due to the platform's motion through the Earth's magnetic field. The combined total magnetic field that these sources make up is detected by the individual coil assemblies of the magnetometer 332. In one example, proper calibration of the coil assemblies can allow for changes in the magnetic field in a magnetic sensor coordinate system to be accurately measured. In addition, knowledge of magnetometer orientation can allow for the change in magnetic field in a global North East Down (NED) coordinate system to be extracted. By combining the change of magnetic field, magnetometer (or sensor) orientation, and the moving platform's speed, the value of the magnetic field gradient can be determined.

In the technology described herein, the sensed magnetic gradients and errors that are internal to the moving platform 310 (e.g., due to motors, actuators, electronics) are evaluated in a local sensor coordinate system (or a magnetometer coordinate system). The magnetometer 332 can be aligned with the aircraft body or weapon body and co-located (or not co-located) with the navigation subsystem. In the NED coordinate system, North, East, Down (NED) is a local level frame. North is defined as the $X_{NE}$-axis and East as the $Y_{NE}$-axis. Thus, by the right hand rule, the $Z_{NE}$-axis is the negative geodetic normal, or down. The origin moves with the missile or aircraft. The airframe body coordinate system has its origin at the center of gravity (CG) of the airframe. The airframe can be that of the moving platform 310. The X-axis points out the nose, Y-axis points out the right wing when in the airframe-up configuration, and Z-axis points down.

Figure 4:
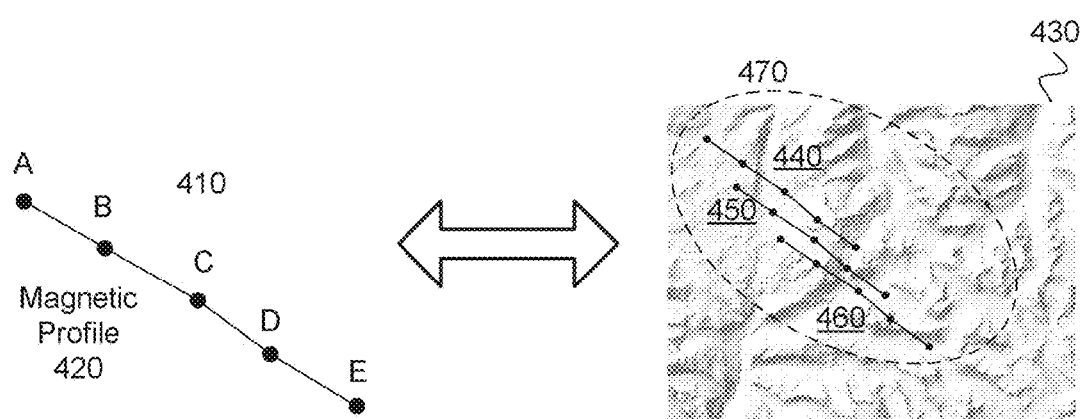
FIG. 4 illustrates matching a sequence of magnetic field gradient measurements to a reference magnetic field gradient map in accordance with an example.

FIG. 4 illustrates matching a sequence of magnetic field gradient measurements in a magnetic profile 420 to a reference magnetic field gradient map 430. The sequence in the magnetic profile 420 can be compared to the reference magnetic field gradient map 430 in order for a moving platform 410 to determine its geographical location. The sequence of magnetic field gradients can be from a plurality of magnetic field gradient measurements taken using a magnetometer onboard the moving platform 410 (as previously described in FIG. 3). In other words, the plurality of magnetic field gradient measurements can be compiled to form the magnetic profile 420. Each magnetic field gradient measurement included in the magnetic profile 420 is associated with a distinct position on the Earth. In addition, each magnetic field gradient measurement is associated with the Earth's magnetic anomaly field. Since the gradient of the Earth's geomagnetic field is of interest, the magnetic profile 420 can include a series of measured spatial variations in the Earth's magnetic field. A rate of change of the magnetic field (i.e., the gradient) can be measured using the magnetometer that is onboard the moving platform 410. The magnetic field gradient measurements can be along the moving platform's direction of motion. Thus, the magnetic profile 420 can include a history of magnetic gradient measurements (or magnetic gradient tensor measurements) for the moving platform 410.

In the example shown in FIG. 4, the magnetic profile 420 can include magnetic field gradient measurements for position A, position B, position C, position D and position E. Therefore, the magnetic profile 420 can include a first value that corresponds to the magnetic field gradient measurement at position A, a second value that corresponds to the magnetic field gradient measurement at position B, and so on. The sequence of measurements included in the magnetic profile 420 can correspond to a path traveled by the moving platform 410. In other words, a portion of the moving platform's path can include traveling through positions A through E. In one example, the magnetic profile 420 can indicate a rate of change in the magnetic field with respect to each of the magnetic field gradient measurements.

In one configuration, the magnetic profile 420 can be compared to a reference magnetic field gradient map 430. In other words, the sequence of magnetic field gradient measurements included in the magnetic profile 420 can be compared with the reference magnetic field gradient map 430. The reference magnetic field gradient map 430 is similar to a terrain map or topographical map, but indicates a magnetic field gradient for a given position on the Earth. The reference magnetic field gradient map 430 can provide information about the Earth's magnetic anomaly field. The reference magnetic field gradient map 430 can be considered as a truth source for magnetic field gradient information. In one example, the reference magnetic field gradient map 430 is provided by the National Geophysical Data Center (NGDC). The reference magnetic field gradient map 430 can provide a spatially stable representation of the gradient of the Earth's magnetic anomaly field. In one example, the reference magnetic field gradient map 430 can be periodically updated (e.g., every year or every five years).

In one example, the sequence of measurements in the magnetic profile 420 can be compared with the reference magnetic field gradient map 430 in order to identify a set of corresponding measurements from the reference magnetic field gradient map 430. In other words, if the moving platform 410 does not exactly know its geographical location (e.g., the moving platform 410 has a general idea of its location, but with some level of uncertainty), but has a set of previous magnetic field gradient measurements, those previous magnetic field gradient measurements can be attempted to be found in the reference magnetic field gradient map 430. By identifying those previous magnetic field gradient measurements on the reference magnetic field gradient map 430, which are each associated with a known geographical location, the moving platform 410 can determine its own geographical location. Thus, the sequence is a unique set of values, and these same values (in the same order) are searched for in the reference magnetic field gradient map 430. As previously explained, the reference magnetic field gradient map 430 can be regarded as a truth source, so each gradient value on the map is associated with a known geographical location (e.g., longitude and latitude).

In one configuration, the sequence of measurements in the magnetic profile 420 can be compared to a plurality of possible trajectories derived from the reference magnetic field gradient map 430. These possible trajectories can be generated based on a general knowledge of the moving platform's location (e.g., a general region in which the moving platform 410 is likely to be within). In addition, the possible trajectories can be generated based on predicted trajectories of the INS onboard the moving platform 410. In other words, the INS can provide a general indication of the moving platform's movements, and based on that information, the moving platform's most likely trajectories can be predicted. In one example, the most likely trajectories can be negatively affected by navigation errors of the INS (e.g., gyroscope and accelerometer drifts). However, if the moving platform's estimated position is determined, this estimated position can be used to improve the accuracy of the INS.

Each possible trajectory can include a series of known magnetic field gradient values. A trajectory that most closely correlates to the sequence of magnetic field gradient measurements in the magnetic profile 420 can be identified. In other words, the trajectory that is identified can be inferred as being substantially the same trajectory that the moving platform 410 is following. The geographical coordinates of the identified trajectory are known based on the reference magnetic field gradient map 430. As a result, the moving platform 410 can determine its own geographical location based on the known geographical coordinates of the identified trajectory.

In one example, the accuracy of the estimated geographical location (or position) of the moving platform 410 based on the magnetic field navigation system can be subject to a number of error sources. These error sources include intrinsic magnetic sensor errors, errors in the magnetic gradient maps, external magnetic sources (e.g., micropulsations diurnal variation, magnetic storms), environmental electromechanical noise aboard the vehicle, unpredictability of the INS errors, etc.

In one configuration, the moving platform 410 can update its INS with the geographical location that is determined using the magnetic navigation system. INS drift can occur over time, which can affect the accuracy of the INS. Therefore, the INS can periodically be informed of an updated geographical location of the moving platform 410. As a result, the impact of INS drift can be minimalized. In one example, the moving platform 410 can employ a Kalman filter to process measurements from independent aiding sources to compensate for the inertial navigation errors resulting from IMU imperfections, mechanical misalignments, and dynamic responses.

In one example, the moving platform 410 can be equipped with a magnetic gradiometer (or magnetometer) and pre-existing magnetic gradient maps. The magnetic gradients can be sensed along the moving platform's trajectory, which can result in the magnetic profile 420 of the magnetic gradients. When a sufficient number of sensed gradient values are available in the magnetic profile 420, a map matching algorithm can be used to fit the magnetic profile 420 to the stored magnetic gradient map in order to determine the moving platform's location. In one example, measured magnetic field gradients (i.e., derived from the magnetic antenna of the magnetometer and provided in a global coordinate system) can be compared with predicted magnetic field gradients (i.e., a set of magnetic gradient profiles based on values from a database or map of magnetic field gradients that are generated along predicted trajectories of the INS). In another example, a Non-Gaussian stochastic estimation technique can be used to estimate the moving platform's position from the magnetic field gradient measurements and the associated reference map.

In one configuration, the number of magnetic field gradient measurements included in the magnetic profile 420 can impact the accuracy of the magnetic field navigation solution. In general, a greater number of magnetic field gradient measurements can provide a more accurate magnetic field navigation solution. For example, if the magnetic profile 420 includes a series of fifty magnetic field gradient measurements, then the likelihood of the series being matched to a possible trajectory (that accurately reflects the actual trajectory of moving platform 410) is greater than if the magnetic profile 420 were to include a series of only ten magnetic field gradient measurements. The navigational accuracy can be dependent on the number and shape of the anomalies that are traversed during the mission. In one example, the accuracy can improve after three or more magnetic anomalies are traversed by the moving platform 410. In another example, the moving platform 410 can obtain an increased number of magnetic field gradient measurements in a reduced period of time when traveling at a relatively high speed. In other words, a slower speed implies that few magnetic anomalies are traversed, which leads to a less diverse path. As a result, a longer time period is likely in order to converge to a navigation solution.

In the example shown in FIG. 4, the magnetic profile 420 that includes the sequence can be compared with the reference magnetic field gradient map 430. As shown in FIG. 4, the reference magnetic field gradient map 430 can illustrate magnetic field gradient values at particular positions on the Earth. In particular, the magnetic profile 420 can be compared with a plurality of possible trajectories from the reference magnetic field gradient map 430. The possible trajectories can include a first possible trajectory 440, a second possible trajectory 450 and a third possible trajectory 460. The possible trajectories can be derived from the reference magnetic field gradient map 430. Each possible trajectory can comprise a series of individual magnetic field gradient measurements. In one example, the possible trajectories that are selected can be selected from a defined region 470 within the reference magnetic field gradient map 430. The defined region 470 can be determined based on general knowledge of the moving platform's location. For example, the moving platform's starting location can be known, and based on a period of time since the moving platform 410 started traveling from the starting location and a predicted average speed, the defined region 470 can be determined. In other words, the defined region 470 represents a likely region in which the moving platform 410 is located at a particular time. As a result, the magnetic profile 420 does not need to be compared with a magnetic map of the entire Earth, but rather can be compared with a portion of the reference magnetic field gradient map 430.

In one example, the sequence of magnetic field gradient measurements in the magnetic profile 420 can be compared with the first possible trajectory 440, the second possible trajectory 450 and the third possible trajectory 460, respectively. Based on the comparison, one of the possible trajectories (e.g., the second possible trajectory 450) can be identified as being a closest match to the sequence of magnetic field gradient measurements in the magnetic profile 420. In other words, the known magnetic field gradient values that comprise the second possible trajectory 450 substantially match the magnetic field gradient measurements in the magnetic profile 410. Thus, in this example, the second possible trajectory 450 can be inferred as being substantially the same trajectory that is being followed by the moving platform 410. Since the geographical coordinates of the second possible trajectory 450 are known, the moving platform's geographical location can be determined.

Figure 5:
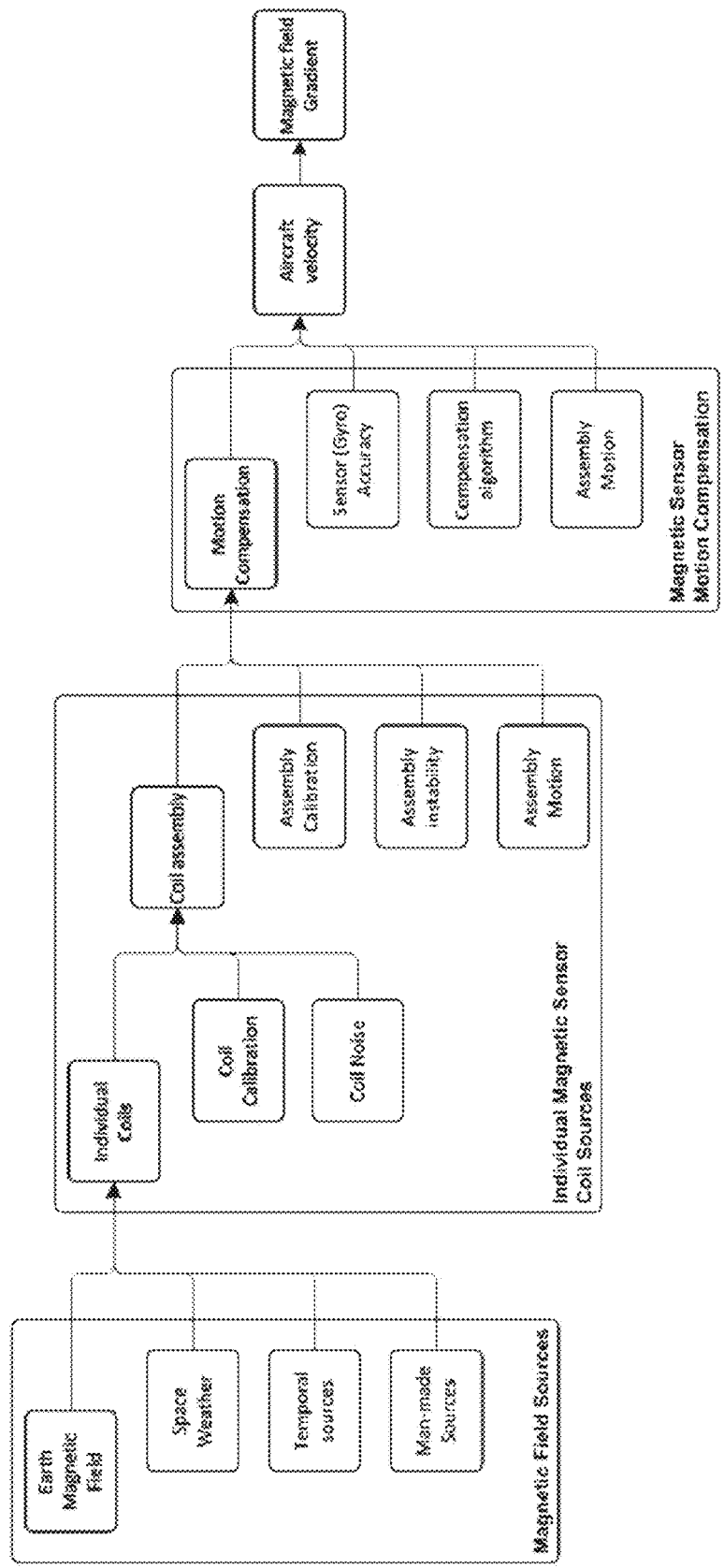
FIG. 5 illustrates a technique for measuring a magnetic field gradient in accordance with an example.

FIG. 5 illustrates an exemplary technique for measuring a magnetic field gradient. As previously discussed, individual coils of a magnetometer can measure the Earth's magnetic field. In addition, the individual coils can pick up other magnetic field sources, such as space weather, temporal sources or man-made sources. In addition, there are sources associated with the coil assembly and calibration. Proper calibration of the coil assemblies can allow for the change of magnetic field to be accurately measured. By combining the change of magnetic field, sensor orientation, and a platform speed, the magnetic field gradient can be determined.

In one example, a magnetic sensor motion compensation system can operate to correct errors in the magnetometer (e.g., orientation drift of the magnetometer). The motion compensation can operate separately from an inertial navigation system (INS) that is responsible for the platform orientation and velocity. The magnetometer (and magnetometer antenna) is not likely to be co-located with the INS, so the magnetometer's orientation is likely to be different. In addition, vibration frequencies that influence the magnetometer's signal can occur at a higher rate than most general purpose INS are designed to handle.

Figure 6:
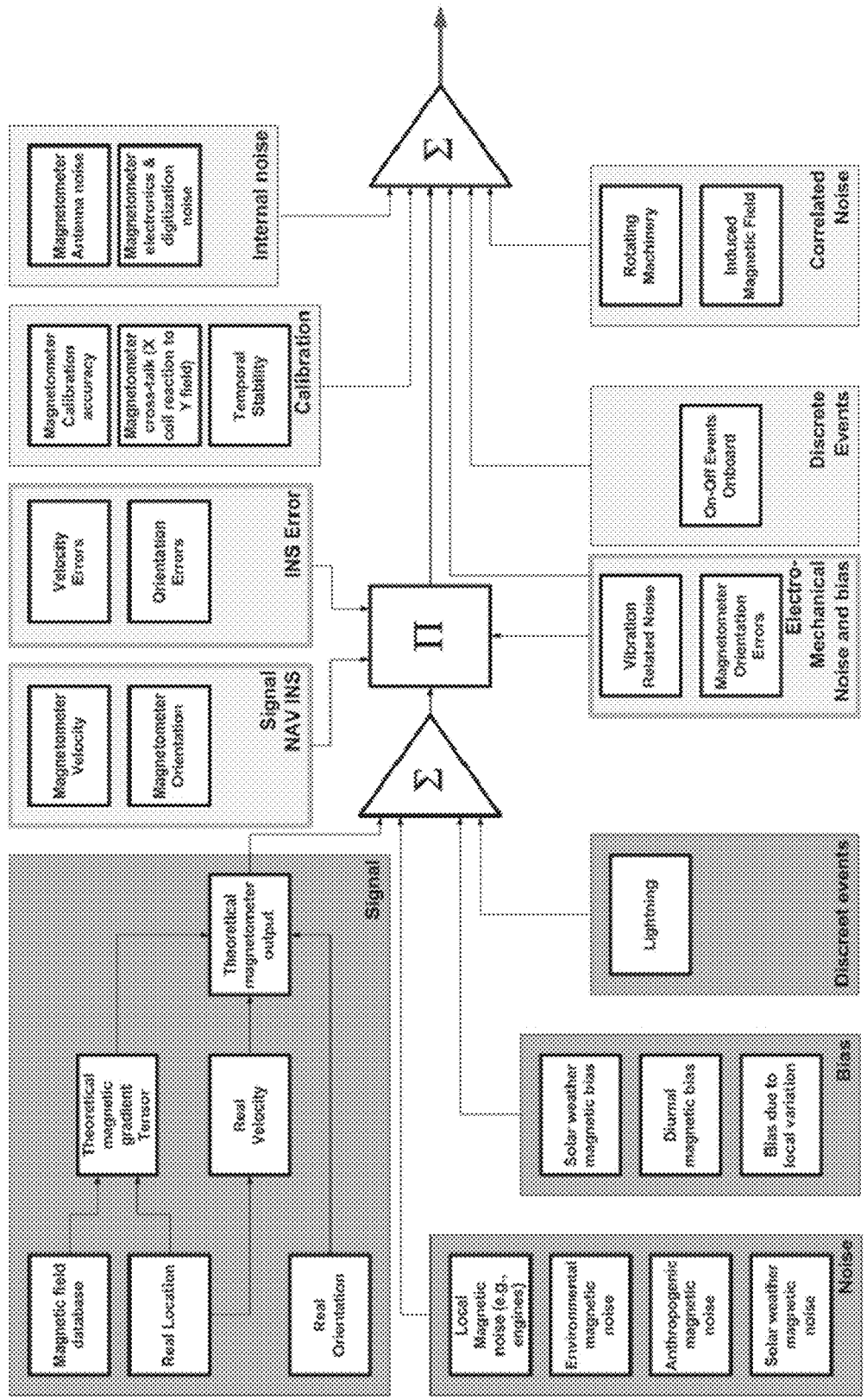
FIG. 6 illustrates an output of a magnetometer in accordance with an example.

FIG. 6 illustrates an exemplary output of a magnetometer along an actual flight trajectory of a moving platform. As shown in FIG. 6, the signal (e.g., a signal generated by a gradiometer), noise, bias, and discrete events describe events that occur outside the moving platform. These events occur in the global NED coordinate system and are modeled in that coordinate system. The signal NAV INS (e.g., an ideal INS output that is used to convert the signal into the magnetic sensor coordinate system in which the magnetometer is calibrated), the INS error and the electro-mechanical noise and bias shown in FIG. 6 are related to the transformation between the NED and the sensor coordinate system. The calibration, internal noise, discrete events and correlated noise shown in FIG. 6 take place aboard the moving platform and are modeled in the platform body coordinate system.

Figure 7:
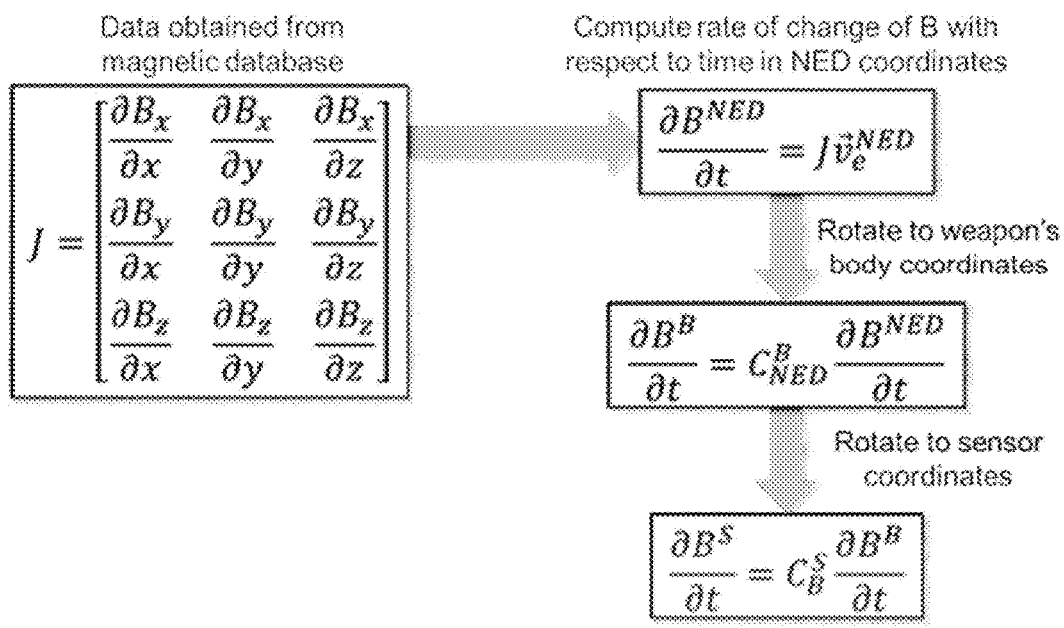
FIG. 7 illustrates a technique for computing a magnetic field gradient in accordance with an example.

FIG. 7 illustrates an exemplary technique for computing a magnetic field gradient in a sensor coordinate system. A rate of change of the magnetic field (i.e., the gradient) that a platform is measuring can be determined using the platform's location to query the magnetic gradient maps. The queried gradient is in the NED coordinate system, and can be translated to a magnetic sensor coordinate system. As shown in FIG. 7, the rate of change of the magnetic field with respect to time can be computed in the sensor coordinate system.

In one configuration, a map matching algorithm can evaluate a set of hypothetical candidate trajectories to determine a likelihood of any of these candidate trajectories being the correct trajectory of the moving platform. In other words, the map matching algorithm determines the likelihood of any one of the hypothetical trajectories being the one that best represents the moving platform's actual trajectory. The algorithm selects the trajectory that is most likely to be correct, and based on this trajectory, a measured position error can be computed.

The map matching algorithm can generate and evaluate a set of hypothetical trajectories to determine which hypothetical trajectory most closely represents the sensed trajectory. In this way, the algorithm can obtain an estimate of the latitude, longitude, and altitude correlated path that was flown. The hypothetical trajectories are generated based on the navigation solution, hypothetical initial position, velocity errors and attitude errors.

Furthermore, the hypothetical magnetic measurement for each point on a hypothetical trajectory is determined using a magnetic sensor model embedded in the algorithm which has access to a magnetic map database. The history of the hypothetical magnetic measurements is compared to the history of the sensor measurements for each of the hypothetical trajectories. This comparison yields a measure of the likelihood of a particular hypothetical trajectory being the correct one relative to the other hypothetical trajectories. The algorithm can collect several seconds worth (e.g., nominally 150 seconds) of sensor measurements. As each sensor measurement is received, the algorithm can update each of the hypothetical trajectories and update the likelihood calculation for each trajectory. This is more computationally efficient when compared with the alternative of calculating the likelihood of each trajectory when the 150 seconds lapses.

The first step in calculating the hypothetical trajectories is to determine the number of offsets that will be performed for each measurement update in the measurement period (e.g., 150 seconds). This determination is performed prior to receiving any sensor measurements for the current measurement period and is based on the size of the search grid ($\sigma_{RM}$). In general, as the value of $\sigma_{RM}$ decreases the closer together the hypothetical trajectories will be. The algorithm can perform offsets for eight different types of data accounting for hypothetical initial attitude, position and velocity errors. The eight hypothetical trajectory offsets can be for a total number of different attitude offset values about the north axis, a total number of different attitude offset values about the east axis used, a number of different position offset values in the north direction, a number of different position offset values in the east direction, a number of different position offset values in the down direction, a number of different velocity offset values in the north direction, a number of different velocity offset values in the east direction, and a number of different velocity offset values in the down direction. The value of $\sigma_{RM}$ can initially be 60 meters. This value is increased as required to reduce the number of hypothetical trajectories due to memory and throughput constraints. The offset size for attitude, position, altitude, and velocity can be calculated. These offsets are used in the process for generating the hypothetical trajectories.

Each hypothetical trajectory can be updated each time a magnetic sensor measurement is received. Upon receipt of a new magnetic sensor measurement, the location, altitude and velocity for the current point in each hypothetical trajectory is calculated. The hypothetical velocity, latitude, longitude, and altitude are the three values used as inputs to a sensor model. The sensor model returns the expected measurement at the hypothetical location and with the hypothetical velocity. The value obtained from the sensor model will be compared against the hypothetical rotations of the sensor measurement to determine the likelihood of the each hypothetical trajectory being the solution.

The sensor model has an embedded database of the rate of change (i.e., gradient) of the magnitude of magnetic field in the down direction relative to position in NED. The model then obtains $$\frac{\partial B_z}{\partial R_N}, \frac{\partial B_z}{\partial R_E} \text{ and } \frac{\partial B_z}{\partial R_D}$$

at the location and altitude for a hypothetical trajectory by using tri-linear interpolation on the values obtained from the database. The rate of change of the magnitude of the magnetic field in the down direction with respect to time is computed as follows:

$$\frac{\partial B_{z-hyp}}{\partial t} = \begin{bmatrix} \frac{\partial B_z}{\partial R_N} & \frac{\partial B_z}{\partial R_E} & \frac{\partial B_z}{\partial R_D} \end{bmatrix} \vec{V}_{e-hyp}^{NED},$$

which is the value used for comparison against $$\frac{\partial \hat{B}_z}{\partial t}$$

along all hypothetical trajectories to determine which trajectory is the most likely to be correct.

The map matching algorithm can compute and provide position error measurements to a navigation Kalman filter. The navigation Kalman filter can process the measurements and provide strapdown equations with corrections used to contain the error growth of the navigation solution.

Figure 8:
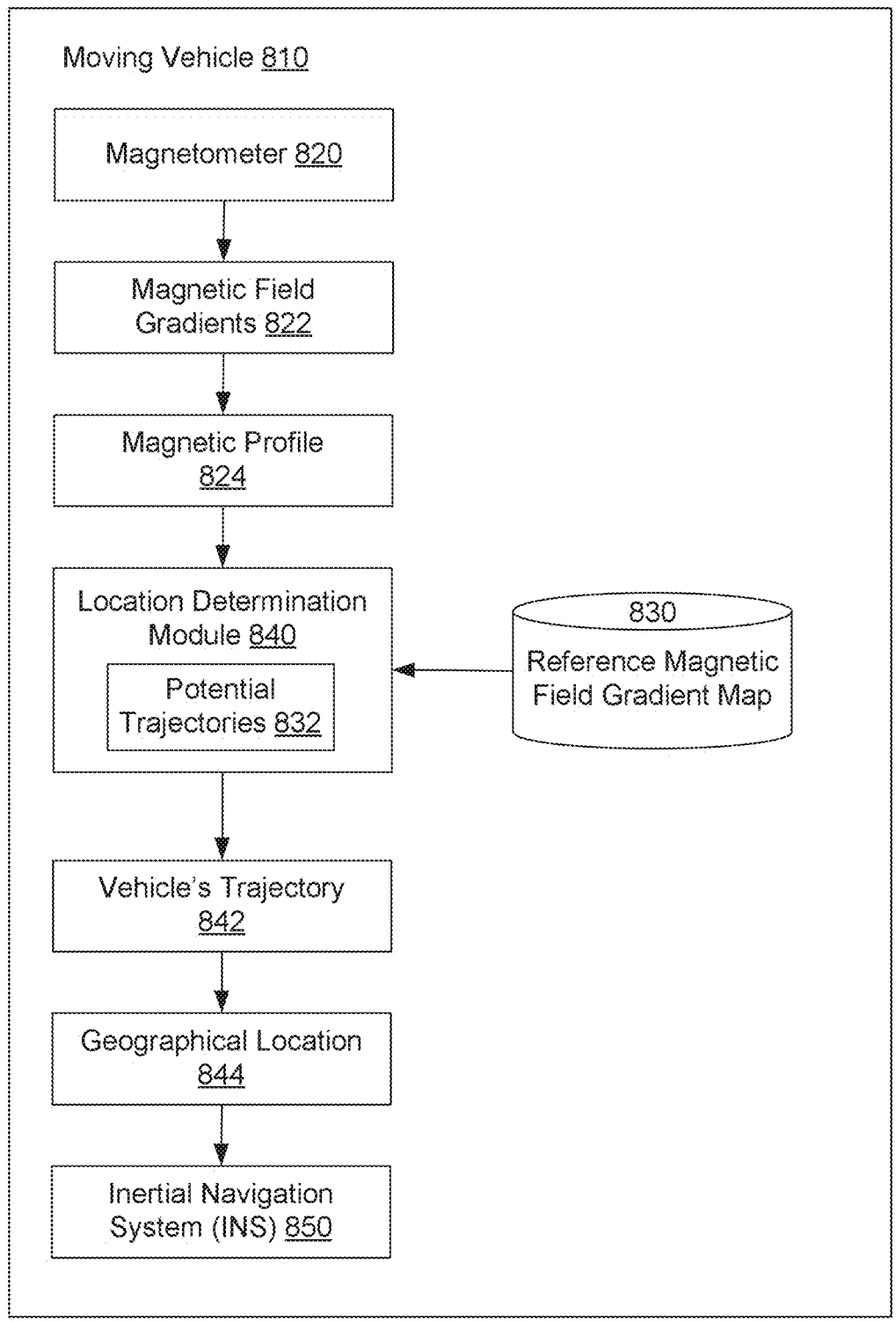
FIG. 8 illustrates a system and related operations for determining a geographical location of a moving vehicle based on a plurality of magnetic field gradient measurements of the Earth in accordance with an example.

FIG. 8 illustrates an exemplary system and related operations for determining a geographical location of a moving vehicle 810 based on a plurality of magnetic field gradient measurements 822 of the Earth. The moving vehicle 810 can include, but is not limited to, a self-propelled weapon system (e.g., a missile) or an aircraft. The magnetometer 820 (e.g., a vector magnetometer) can be installed onboard the moving vehicle 810. As the moving vehicle 810 travels along a path to a destination, the magnetometer 820 on the moving vehicle 810 can take magnetic field gradient measurements 822. For example, the magnetometer 820 can take a magnetic field gradient reading (corresponding to a distinct position on the Earth) X times per second for a duration of Y seconds. As a non-limiting example, the magnetometer 820 can collect magnetic field gradient measurements at a rate of 2,000 measurements per second (or greater) over a duration of 150 seconds. As a result, the magnetometer 820 can collect a plurality of magnetic field gradient measurements 822 that correspond to the moving vehicle's path. The plurality of magnetic field gradient measurements 822 can be compiled into a sequence and included in a magnetic profile 824. The magnetic profile 824 can represent the magnetic field gradients 822 that have been sensed by the magnetometer 820 while the moving vehicle 810 travels to the destination.

The magnetic profile 824 can be provided to a location determination module 840. In addition, potential trajectories 832 of the moving vehicle 810 can be determined by the location determination module 840. The potential trajectories 832 can be derived from a reference magnetic field gradient map 830 stored in a database. The location determination module 840 can determine the potential trajectories 832 in real-time and at periodic intervals based on the reference magnetic field gradient map 830. The potential trajectories 832 can be predicted based on the moving vehicle's last known position (e.g., as provided by GPS or INS systems of the moving vehicle 810). The reference magnetic field gradient map is a topographical map representing the magnetic field at specific positions of the Earth. In other words, the reference magnetic field gradient map provides known magnetic field values. Thus, the potential trajectories 832 can each comprise of a series of points (or magnetic field gradient values) that are selected from the reference magnetic field gradient map. These potential trajectories 832 are predicted as being traveled on by the moving vehicle 810. In other words, as the moving vehicle 810 travels along the path, the potential trajectories 832 that the moving vehicle 810 might take are predicted.

The location determination module 840 can compare the magnetic profile 824 with the potential trajectories 832 (or hypothetical trajectories) based on the database 830, and based on the comparison, the location determination module 840 can identify the vehicle's trajectory 842. In other words, the identified trajectory 842 includes magnetic field gradient values that most closely correlate to the magnetic field gradients 822 in the magnetic profile 824. Thus, this trajectory 842 can be assumed as being the trajectory that is followed by the moving vehicle 810. In this example, a direct correlation is made between measured gradients and the map, but a set of gradient values on the map are selected in order to perform the comparison. Since the geographical coordinates of the trajectory 842 are known, the moving vehicle's geographical location 844 can be determined. The geographical location 844 can include a longitude and latitude that describes the moving vehicle's position. The geographical location 844 can be provided to an inertial navigation system (INS) 850 of the moving vehicle 810. By receiving an updated geographical location, the INS 850 can correct for drift that occurs over time.

Figure 9:
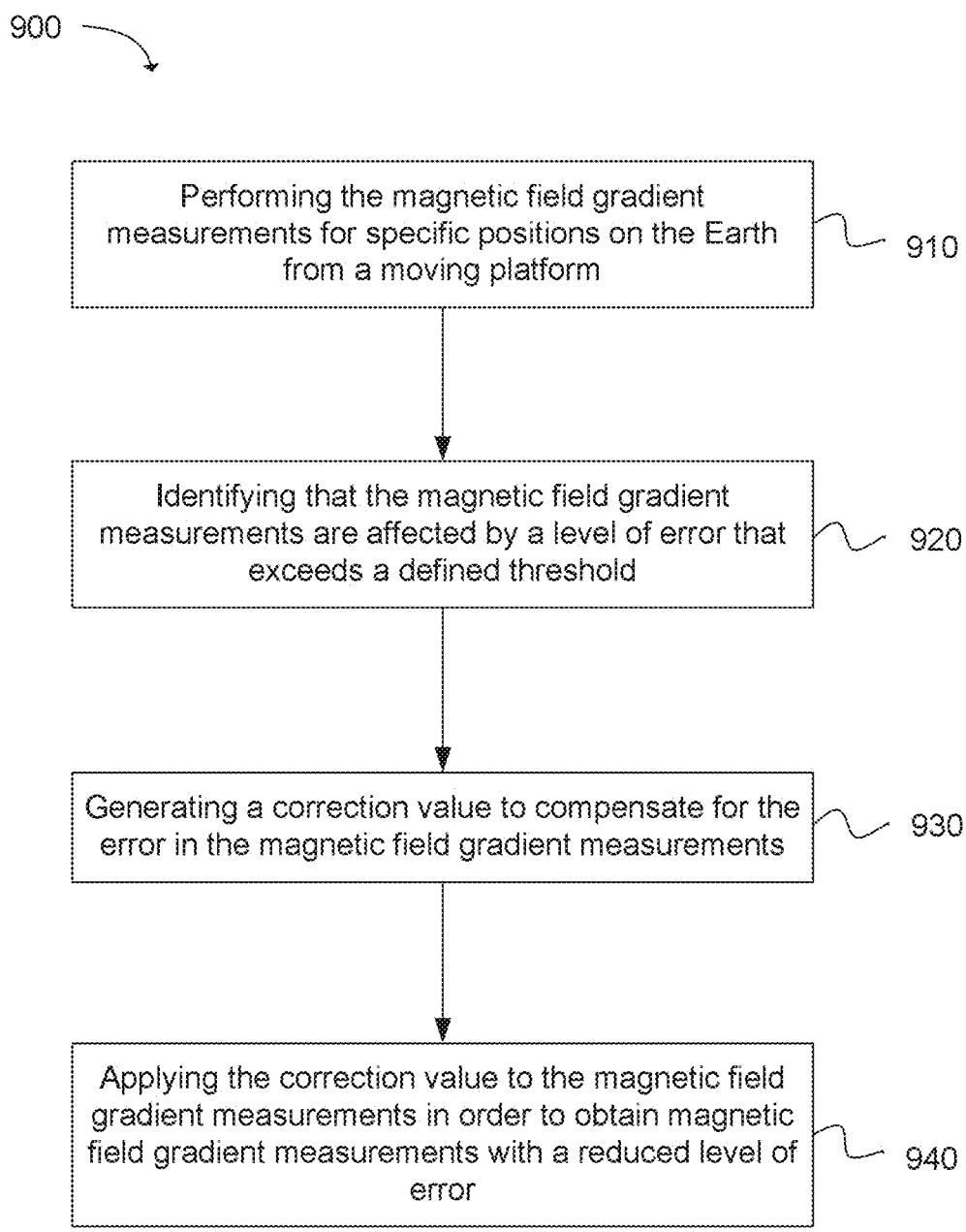
FIG. 9 depicts a flow chart of a method for determining a magnetic field gradient in accordance with an example.

FIG. 9 depicts a flow chart of a method for determining a geographical location of a moving platform. The method can be executed as instructions on a machine, where the instructions are included on at least one computer readable medium or one non-transitory machine readable storage medium. The method can be implemented using one or more processors of the machine. The method can include the operation of performing magnetic field gradient measurements from the moving platform, each magnetic field gradient corresponding to a position on the Earth, the magnetic field gradients being continuously measured while the moving platform is traveling along a path to a destination, as in block 910. The method can include the operation of creating a sequence of magnetic field gradient measurements that correspond to the path traveled by the moving platform, as in block 920. The method can include the operation of comparing the sequence of magnetic field gradient measurements for the path to a plurality of possible trajectories derived from a reference magnetic field gradient map, as in block 930. The method can include the operation of identifying a trajectory from the reference magnetic field gradient map that correlates to the sequence of magnetic field gradient measurements, the trajectory having known geographical coordinates, as in block 940. The method can include the operation of determining the geographical location of the moving platform based on the known geographical coordinates of the trajectory, as in block 950.

In one example, the method can further include the operation of updating an inertial navigation system (INS) of the moving platform with the geographical location in order to mitigate INS drift. In another example, the operation of determining the geographical location includes determining latitude and a longitude associated with the moving platform based on the trajectory identified from the reference magnetic field gradient map.

In one example, the method can further include the operation of performing the magnetic field gradient measurements using a magnetometer that is onboard the moving platform. In another example, the moving platform is traveling at a defined velocity of Mach 0.5 or greater. In yet another example, the moving platform is a self-propelled guided weapon or an aircraft. In addition, the magnetic field gradient measurements are of the Earth's magnetic anomaly field. In one example, determining the geographical location further comprises using the known geographical coordinates of the moving platform to mitigate positions errors in a previous inertial navigation system (INS) solution.

In one example, the method can further include the operation of performing the magnetic field gradient measurements using a vector magnetometer onboard the moving platform, wherein the vector magnetometer includes a plurality of coils for performing the magnetic field gradient measurements, wherein a signal for each coil i is represented as $$V_i = \frac{d(\vec{A}_i \cdot \vec{B})}{dt},$$

which is equal to $$\vec{A}_i \cdot \frac{\partial \vec{B}}{\partial t} + \vec{B} \cdot \frac{\partial \vec{A}_i}{\partial t} + (\vec{A}_i \cdot \nabla \vec{B}) \cdot \vec{v},$$

wherein $V_i$ is a voltage in the coil i, $\vec{a}_i$ is an orientation of the coil i, $\vec{B}$ is a magnetic field, $\nabla \vec{B}$ is a magnetic gradient tensor, and $\vec{v}$ represents a moving platform velocity vector. In addition, each magnetic field gradient measurement is a projection of a magnetic field gradient tensor into a direction of motion associated with the moving platform.

Figure 10:
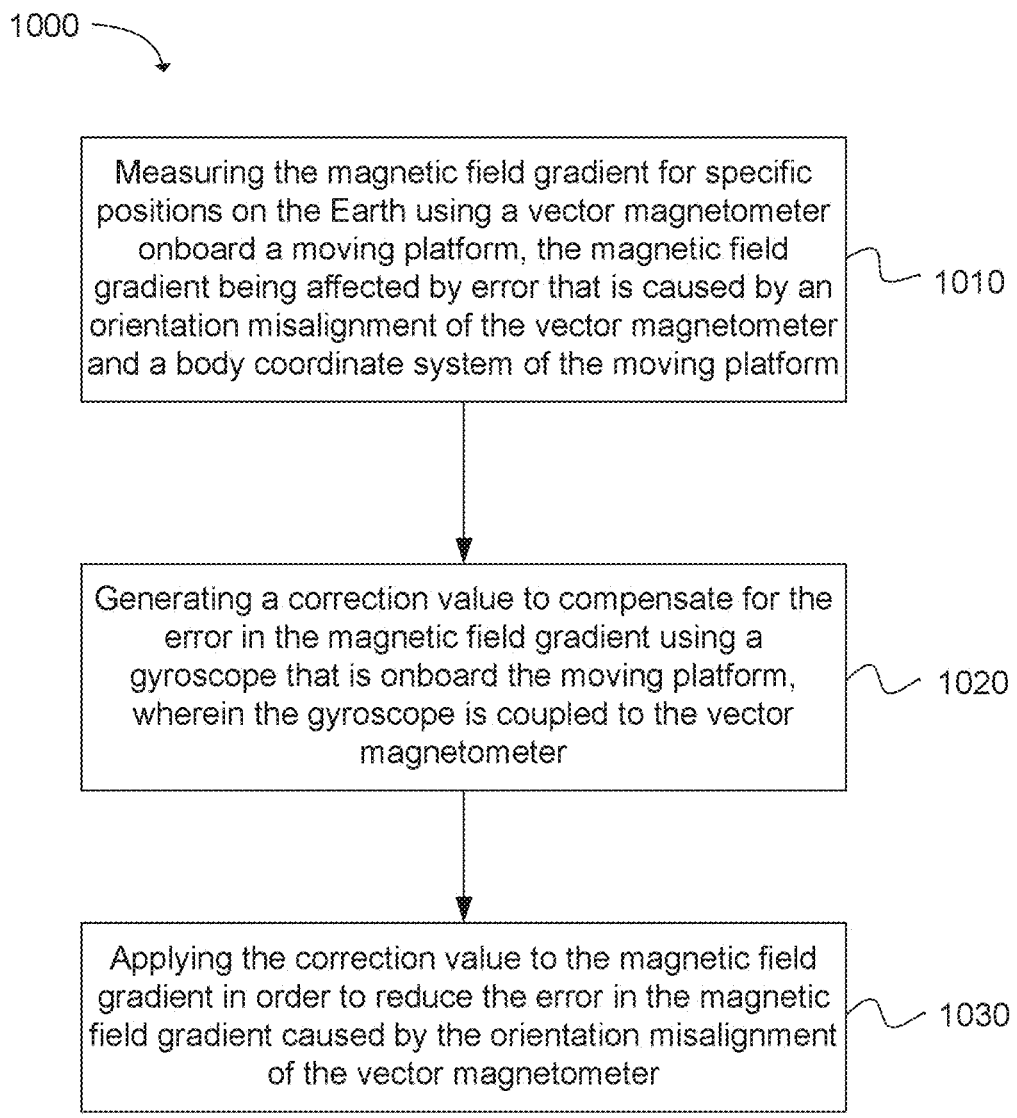
FIG. 10 depicts a flow chart of a method for determining a magnetic field gradient in accordance with an example.

FIG. 10 depicts a flow chart of a method for determining a geographical location. The method can be executed as instructions on a machine, where the instructions are included on at least one computer readable medium or one non-transitory machine readable storage medium. The method can be implemented using one or more processors of the machine. The method can include the operation of identifying a sequence of magnetic field gradient measurements for specific positions on the Earth that correspond to a path traveled by a moving platform, as in block 1010. The method can include the operation of comparing the sequence of magnetic field gradient measurements for the path to a reference magnetic field gradient map, as in block 1020. The method can include the operation of identifying a trajectory from the reference magnetic field gradient map that correlates to the sequence of magnetic field gradient measurements, the trajectory having known geographical coordinates, as in block 1030. The method can include the operation of determining the geographical location of the moving platform based on the known geographical coordinates of the trajectory, as in block 1040.

In one example, the method can further include the operation of updating an inertial navigation system (INS) of the moving platform with the geographical location in order to mitigate INS drift. In another example, the operation of determining the geographical location includes determining a latitude and a longitude associated with the moving platform based on the trajectory identified from the reference magnetic field gradient map. In yet another example, the method can further include the operation of measuring each magnetic field gradient according to a defined frequency while the moving platform is traveling along the path to a destination, wherein each magnetic field gradient corresponds to a position on the Earth.

In one example, the method can further include the operation of measuring each magnetic field gradient using an inductive coil vector magnetometer that is onboard the moving platform. In another example, the operation of comparing further comprises comparing the sequence of magnetic field gradient measurements for the path to a plurality of possible trajectories derived from the reference magnetic field gradient map. In yet another example, the reference magnetic field gradient map is a topographical map of the Earth's magnetic anomaly field.

Figure 11:
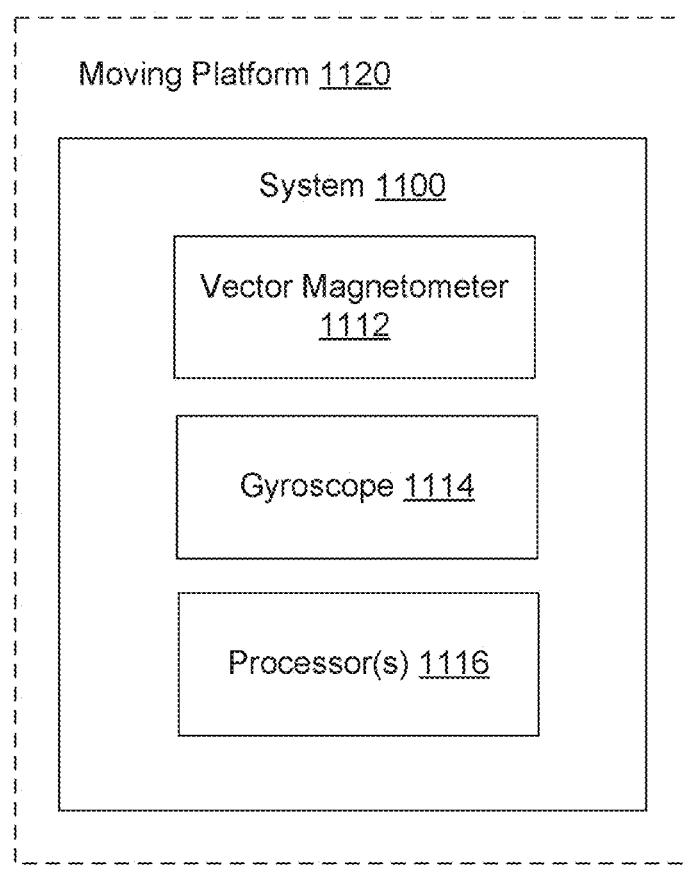
FIG. 11 depicts a system for determining a magnetic field gradient in accordance with an example.

FIG. 11 illustrates a system 1100 for determining a geographical location of a moving platform 1120. The system 1100 can include a vector magnetometer 1112 operable to measure a plurality of magnetic field gradients from the moving platform 1120. Each magnetic field gradient can correspond to a position on the Earth. The magnetic field gradients can be continually measured while the moving platform 1120 is traveling along a path to a destination. The system 1100 can include a data store comprising a reference magnetic field gradient map 1114 that describes the Earth's magnetic anomaly field. The system 1100 can include one or more processors 1116 operable to: identify the plurality of magnetic field gradients; create a sequence of magnetic field gradient measurements from the plurality of magnetic field gradients that correspond to the path traveled by the moving platform 1120; compare the sequence of magnetic field gradient measurements for the path to a plurality of possible trajectories derived from the reference magnetic field gradient map 1114; identify a trajectory from the reference magnetic field gradient map 1114 that correlates to the sequence of magnetic field gradient measurements, the trajectory having known geographical coordinates; and determine the geographical location of the moving platform 1120 based on the known geographical coordinates of the trajectory.

In one example, the one or more processors 1116 are further configured to update an inertial navigation system (INS) of the moving platform 1120 with the geographical location in order to mitigate INS drift. In another example, the system 1100 is installed onboard the moving platform 1120. In yet another example, the system 1100 is installed onboard a self-propelled guided weapon or an aircraft. In addition, the vector magnetometer 1112 includes a plurality of coils for measuring the magnetic field gradient, wherein a signal for each coil i is represented as $$V_i = \frac{d(\vec{A}_i \cdot \vec{B})}{dt},$$

which is equal to $$\vec{A}_i \cdot \frac{\partial \vec{B}}{\partial t} + \vec{B} \cdot \frac{\partial \vec{A}_i}{\partial t} + (\vec{A}_i \cdot \nabla \vec{B}) \cdot \vec{v},$$

wherein $V_i$ is a voltage in the coil i, $\vec{B}_i$ is an orientation of the coil i, $\vec{B}$ is a magnetic field, $\nabla \vec{B}$ is a magnetic gradient tensor, and $\vec{v}$ represents a moving platform velocity vector.

Figure 12:
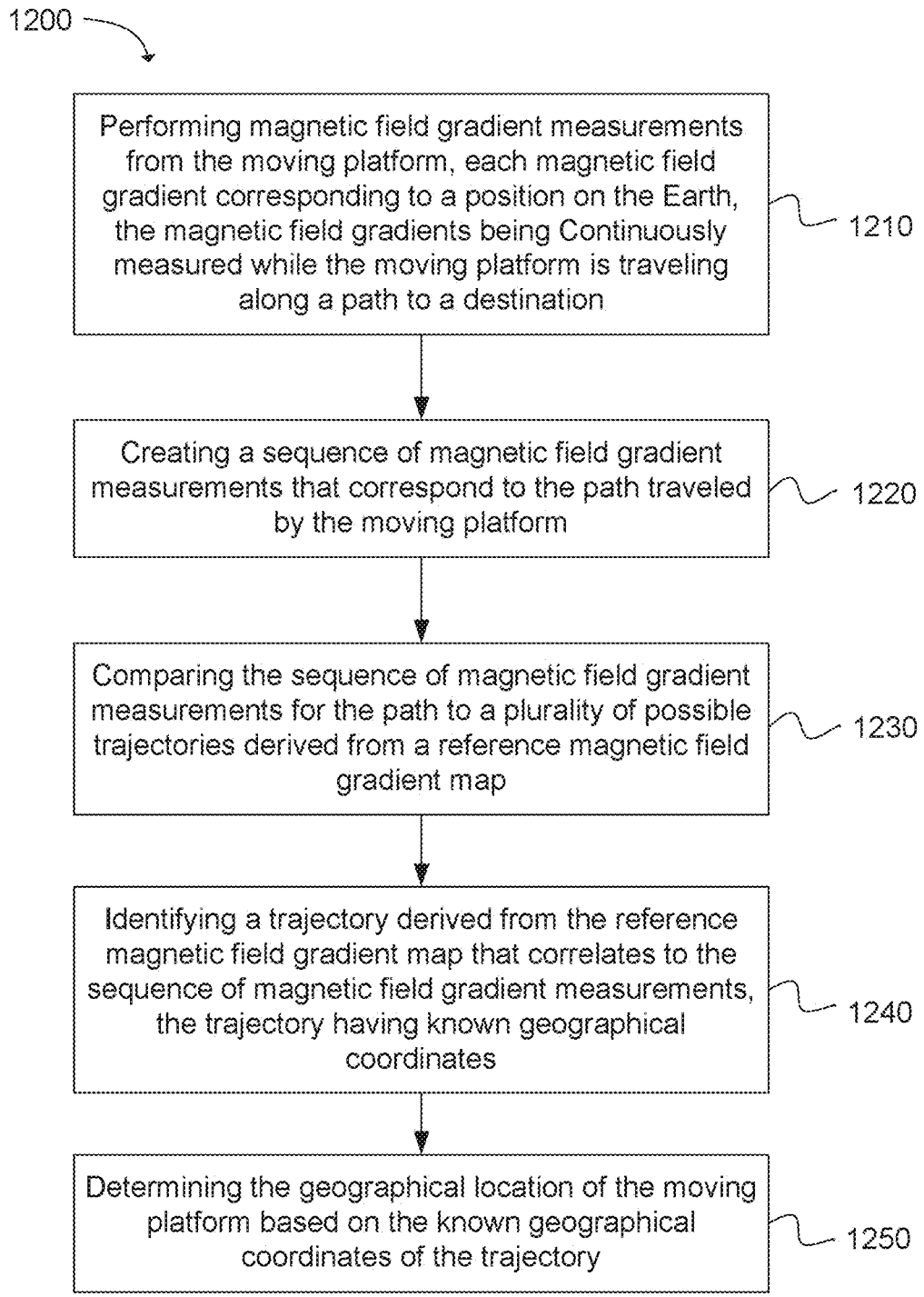
FIG. 12 depicts a flow chart of a method for determining a geographical location of a moving platform in accordance with an example.

FIG. 12 depicts a flow chart of a method for determining a geographical location of a moving platform. The method can be executed as instructions on a machine, where the instructions are included on at least one computer readable medium or one non-transitory machine readable storage medium. The method can be implemented using one or more processors of the machine. The method can include the operation of performing magnetic field gradient measurements from the moving platform, each magnetic field gradient corresponding to a position on the Earth, the magnetic field gradients being continuously measured while the moving platform is traveling along a path to a destination, as in block 1210. The method can include the operation of creating a sequence of magnetic field gradient measurements that correspond to the path traveled by the moving platform, as in block 1220. The method can include the operation of comparing the sequence of magnetic field gradient measurements for the path to a plurality of possible trajectories derived from a reference magnetic field gradient map, as in block 1230. The method can include the operation of identifying a trajectory from the reference magnetic field gradient map that correlates to the sequence of magnetic field gradient measurements, the trajectory having known geographical coordinates, as in block 1240. The method can include the operation of determining the geographical location of the moving platform based on the known geographical coordinates of the trajectory, as in block 1250.

In one example, the method can further include the operation of updating an inertial navigation system (INS) of the moving platform with the geographical location in order to mitigate INS drift. In another example, the operation of determining the geographical location includes determining latitude and a longitude associated with the moving platform based on the trajectory identified from the reference magnetic field gradient map.

In one example, the method can further include the operation of performing the magnetic field gradient measurements using a magnetometer that is onboard the moving platform. In another example, the moving platform is traveling at a defined velocity of Mach 0.5 or greater. In yet another example, the moving platform is a self-propelled guided weapon or an aircraft. In addition, the magnetic field gradient measurements are of the Earth's magnetic anomaly field. In one example, determining the geographical location further comprises using the known geographical coordinates of the moving platform to mitigate positions errors in a previous inertial navigation system (INS) solution.

In one example, the method can further include the operation of performing the magnetic field gradient measurements using a vector magnetometer onboard the moving platform, wherein the vector magnetometer includes a plurality of coils for performing the magnetic field gradient measurements, wherein a signal for each coil i is represented as $$V_i = \frac{d(\vec{A}_i \cdot \vec{B})}{dt},$$

which is equal to $$\vec{A}_i \cdot \frac{\partial \vec{B}}{\partial t} + \vec{B} \cdot \frac{\partial \vec{A}_i}{\partial t} + (\vec{A}_i \cdot \nabla \vec{B}) \cdot \vec{v},$$

wherein $V_i$ is a voltage in the coil i, $\vec{B}_i$ is an orientation of the coil i, $\vec{B}$ is a magnetic field, $\nabla \vec{B}$ is a magnetic gradient tensor, and $\vec{v}$ represents a moving platform velocity vector. In addition, each magnetic field gradient measurement is a projection of a magnetic field gradient tensor into a direction of motion associated with the moving platform.

Figure 13:
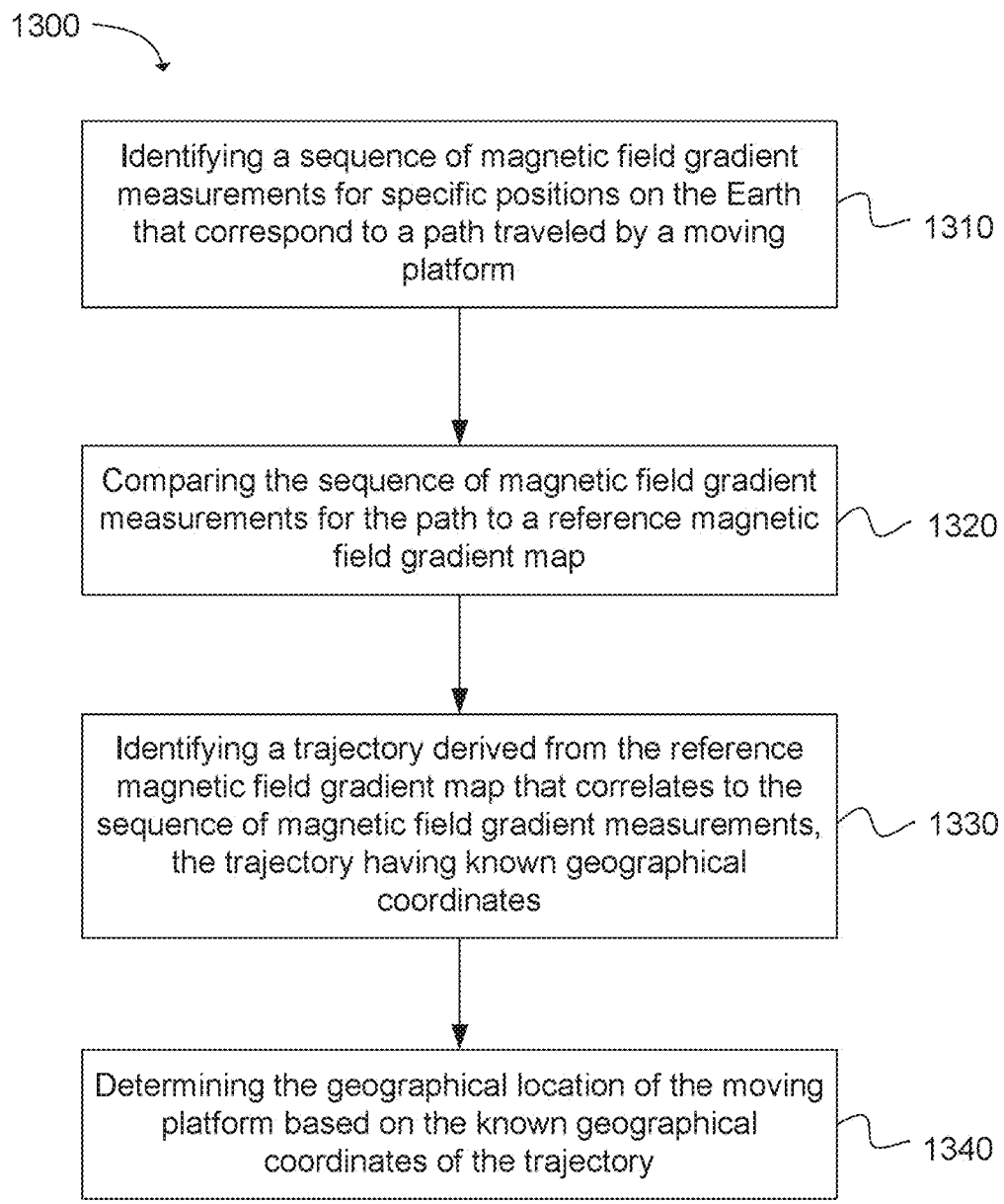
FIG. 13 depicts a flow chart of a method for determining a geographical location in accordance with an example.

FIG. 13 depicts a flow chart of a method for determining a geographical location. The method can be executed as instructions on a machine, where the instructions are included on at least one computer readable medium or one non-transitory machine readable storage medium. The method can be implemented using one or more processors of the machine. The method can include the operation of identifying a sequence of magnetic field gradient measurements for specific positions on the Earth that correspond to a path traveled by a moving platform, as in block 1310. The method can include the operation of comparing the sequence of magnetic field gradient measurements for the path to a reference magnetic field gradient map, as in block 1320. The method can include the operation of identifying a trajectory from the reference magnetic field gradient map that correlates to the sequence of magnetic field gradient measurements, the trajectory having known geographical coordinates, as in block 1330. The method can include the operation of determining the geographical location of the moving platform based on the known geographical coordinates of the trajectory, as in block 1340.

In one example, the method can further include the operation of updating an inertial navigation system (INS) of the moving platform with the geographical location in order to mitigate INS drift. In another example, the operation of determining the geographical location includes determining a latitude and a longitude associated with the moving platform based on the trajectory identified from the reference magnetic field gradient map. In yet another example, the method can further include the operation of measuring each magnetic field gradient according to a defined frequency while the moving platform is traveling along the path to a destination, wherein each magnetic field gradient corresponds to a position on the Earth.

In one example, the method can further include the operation of measuring each magnetic field gradient using an inductive coil vector magnetometer that is onboard the moving platform. In another example, the operation of comparing further comprises comparing the sequence of magnetic field gradient measurements for the path to a plurality of possible trajectories derived from the reference magnetic field gradient map. In yet another example, the reference magnetic field gradient map is a topographical map of the Earth's magnetic anomaly field.

Figure 14:
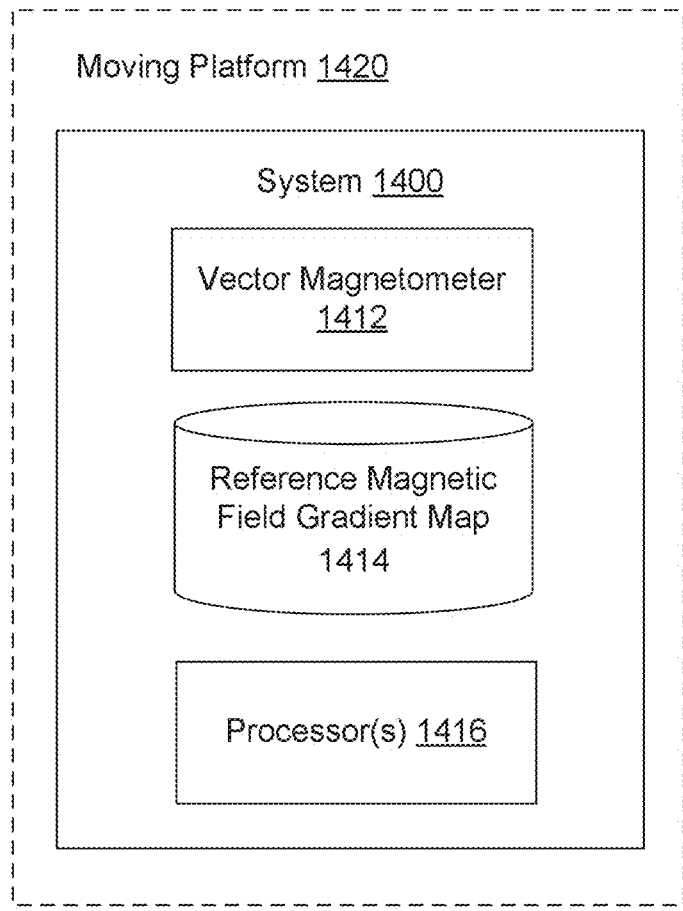
FIG. 14 depicts a system for determining a geographical location of a moving platform in accordance with an example.

FIG. 14 illustrates a system 1400 for determining a geographical location of a moving platform 1420. The system 1400 can include a vector magnetometer 1412 operable to measure a plurality of magnetic field gradients from the moving platform 1420. Each magnetic field gradient can correspond to a position on the Earth. The magnetic field gradients can be continually measured while the moving platform 1420 is traveling along a path to a destination. The system 1400 can include a data store comprising a reference magnetic field gradient map 1414 that describes the Earth's magnetic anomaly field. The system 1400 can include one or more processors 1416 operable to: identify the plurality of magnetic field gradients; create a sequence of magnetic field gradient measurements from the plurality of magnetic field gradients that correspond to the path traveled by the moving platform 1420; compare the sequence of magnetic field gradient measurements for the path to a plurality of possible trajectories derived from the reference magnetic field gradient map 1414; identify a trajectory from the reference magnetic field gradient map 1414 that correlates to the sequence of magnetic field gradient measurements, the trajectory having known geographical coordinates; and determine the geographical location of the moving platform 1420 based on the known geographical coordinates of the trajectory.

In one example, the one or more processors 1416 are further configured to update an inertial navigation system (INS) of the moving platform 1420 with the geographical location in order to mitigate INS drift. In another example, the system 1400 is installed onboard the moving platform 1420. In yet another example, the system 1400 is installed onboard a self-propelled guided weapon or an aircraft. In addition, the vector magnetometer 1412 includes a plurality of coils for measuring the magnetic field gradient, wherein a signal for each coil i is represented as $$V_i = \frac{d(\vec{A}_i \cdot \vec{B})}{dt},$$

which is equal to $$\vec{A}_i \cdot \frac{\partial \vec{B}}{\partial t} + \vec{B} \cdot \frac{\partial \vec{A}_i}{\partial t} + (\vec{A}_i \cdot \nabla \vec{B}) \cdot$$

$\vec{v}$, wherein $V_i$ is a voltage in the coil i, $\vec{B}_i$ is an orientation of the coil i, $\vec{B}$ is a magnetic field, $\nabla \vec{B}$ is a magnetic gradient tensor, and $\vec{v}$ represents a moving platform velocity vector.

Various techniques, or certain aspects or portions thereof, may take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, or other medium for storing electronic data. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A system for performing magnetic field gradient measurements, the system comprising:
   an inductive coil vector magnetometer that is onboard a moving platform, the inductive coil vector magnetometer operable to perform the magnetic field gradient measurements for specific positions on the Earth from the moving platform;
   a gyroscope, coupled to the vector magnetometer, that is operable to generate a correction value to compensate for error in the magnetic field gradient measurements captured by the inductive coil vector magnetometer; and
   one or more processors operable to:
   identify that the magnetic field gradient measurements are affected by a level of error that exceeds a defined threshold;
   identify the correction value generated at the gyroscope to compensate for the error in the magnetic field gradient measurements; and
   apply the correction value generated at the gyroscope to the magnetic field gradient measurements in order to obtain magnetic field gradient measurements with a reduced level of error,
   wherein the correction value received from the gyroscope comprises a relative rotation matrix and is applied to the magnetic field gradient measurements to relate a coil vector magnetometer antenna and an airframe body coordinate system to compensate for high frequency airframe vibrations that causes disorientation of the inductive coil vector magnetometer.

2. The system of claim 1, wherein the correction value compensates for a misalignment between an orientation of the airframe body coordinate system associated with the moving platform and an orientation of the magnetometer onboard the moving platform.

3. The system of claim 1, wherein the error is caused by the high frequency airframe vibrations on the moving platform due to a speed of the moving platform.

4. The system of claim 1, wherein the magnetic field gradient measurements are performed according to a range of approximately 2000 to 50,000 times per second.

5. The system of claim 1, wherein a magnetic field gradient measurement is a projection of a magnetic field gradient tensor into a direction of motion associated with the moving platform.

6. The system of claim 1, wherein the moving platform is traveling at a defined velocity of Mach 0.5 or greater.

7. The system of claim 1, wherein the moving platform is a self-propelled guided weapon or an aircraft.

8. A system for determining a magnetic field gradient, the system comprising:
   a vector magnetometer onboard a moving platform;
   a gyroscope onboard the moving platform and coupled to the vector magnetometer; and
   one or more processors operable to:
   measure the magnetic field gradient for specific positions on the Earth using the vector magnetometer onboard the moving platform, the magnetic field gradient being affected by error that is caused by an orientation misalignment of the vector magnetometer and a body coordinate system of the moving platform;
   generate a correction value to compensate for the error in the magnetic field gradient using the gyroscope that is onboard the moving platform; and
   apply the correction value to the magnetic field gradient in order to reduce the error in the magnetic field gradient caused by the orientation misalignment of the vector magnetometer,
   wherein the correction value comprises a relative rotation matrix and is applied to the magnetic field gradient to relate a coil vector magnetometer antenna and an airframe body coordinate system to compensate for high frequency airframe vibrations that causes disorientation of the inductive coil vector magnetometer.

9. The system of claim 8, wherein the one or more processors are further operable to generate the correction value to compensate for the error in the magnetic field gradient when an error level exceeds a defined threshold.

10. The system of claim 8, wherein the one or more processors are further operable to generate the correction value to compensate for the error in the magnetic field gradient when the moving platform is traveling at a velocity that exceeds a defined threshold.

11. The system of claim 8, wherein the one or more processors are further operable to generate the correction value to compensate for the error in the magnetic field gradient when the moving platform is traveling at a defined velocity of Mach 0.5 or greater.

12. The system of claim 8, wherein the correction value is provided by the gyroscope onboard the moving platform.

13. The system of claim 8, wherein the error is caused by the high frequency airframe vibrations on the moving platform due to a speed of the moving platform.

14. The system of claim 8, wherein the magnetic field gradient is of the Earth's magnetic anomaly field.

15. The system of claim 8, wherein the one or more processors are further operable to determine the magnetic field gradient by converting the magnetic field gradient from a local coordinate system to a North East Down (NED) coordinate system of the moving platform.

16. A system for determining a magnetic field gradient, the system comprising:
 a vector magnetometer operable to measure the magnetic field gradient for specific positions on the Earth;
 a gyroscope, coupled to the vector magnetometer, that is operable to generate a correction value to compensate for error in the magnetic field gradient; and
 one or more processors operable to:
  identify the magnetic field gradient;
  identify the correction value; and
  apply the correction value to the magnetic field gradient,
 wherein the vector magnetometer and the gyroscope are onboard a moving platform,
 wherein the correction value received from the gyroscope comprises a relative rotation matrix and is applied to the magnetic field gradient to relate a coil vector magnetometer antenna and an airframe body coordinate system to compensate for high frequency airframe vibrations that causes disorientation of the inductive coil vector magnetometer.

17. The system of claim 16, wherein the gyroscope is operable to generate the correction value when the error in the magnetic field gradient exceeds a defined threshold and the moving platform is traveling at a defined velocity.

18. The system of claim 16, wherein the error in the magnetic field gradient is caused by a misalignment of a local coordinate system associated with the moving platform and an orientation of the vector magnetometer.

* * * * *